United States Patent
Libert et al.

(10) Patent No.: US 9,978,898 B2
(45) Date of Patent: *May 22, 2018

(54) PHOTOVOLTAIC CELLS WITH IMPROVED MULTILAYER BACKSHEET

(71) Applicant: E I DU PONT DE NEMOURS AND COMPANY, Wilmington, DE (US)

(72) Inventors: Timothy A Libert, Hockessin, DE (US); Jingjing Xu, Wilmington, DE (US); Barry Alan Morris, Wilmington, DE (US); Benjamin Andrew Smillie, Kingston (CA); Richard T Chou, Hockessin, DE (US)

(73) Assignee: E. I. DU PONT DE NEMOURS AND COMPANY, Wilmington, DE (US)

( * ) Notice: Subject to any disclaimer, the term of this patent is extended or adjusted under 35 U.S.C. 154(b) by 338 days.

This patent is subject to a terminal disclaimer.

(21) Appl. No.: 14/699,005

(22) Filed: Apr. 29, 2015

(65) Prior Publication Data

US 2015/0311368 A1  Oct. 29, 2015

Related U.S. Application Data

(60) Provisional application No. 61/985,576, filed on Apr. 29, 2014, provisional application No. 61/985,579, filed on Apr. 29, 2014.

(51) Int. Cl.
| | |
|---|---|
| *B32B 27/34* | (2006.01) |
| *H01L 31/049* | (2014.01) |
| *C08L 77/02* | (2006.01) |
| *B32B 27/08* | (2006.01) |
| *B32B 27/20* | (2006.01) |
| *B32B 27/28* | (2006.01) |
| *B32B 27/30* | (2006.01) |
| *B32B 27/32* | (2006.01) |
| *B32B 27/38* | (2006.01) |
| *B32B 27/40* | (2006.01) |
| *C08K 3/22* | (2006.01) |

(52) U.S. Cl.
CPC ............ *H01L 31/049* (2014.12); *B32B 27/08* (2013.01); *B32B 27/20* (2013.01); *B32B 27/283* (2013.01); *B32B 27/304* (2013.01); *B32B 27/32* (2013.01); *B32B 27/34* (2013.01); *B32B 27/38* (2013.01); *B32B 27/40* (2013.01); *C08L 77/02* (2013.01); *B32B 2264/102* (2013.01); *B32B 2270/00* (2013.01); *B32B 2307/4026* (2013.01); *B32B 2307/412* (2013.01); *B32B 2307/7265* (2013.01); *B32B 2457/12* (2013.01); *C08K 2003/2241* (2013.01); *C08K 2003/2296* (2013.01); *Y02E 10/50* (2013.01)

(58) Field of Classification Search
CPC ....... B32B 27/00; B32B 7/00; C08L 23/0807; C08G 81/028
See application file for complete search history.

(56) References Cited

U.S. PATENT DOCUMENTS

| | | | |
|---|---|---|---|
| 3,264,272 | A | 8/1966 | Rees |
| 4,174,358 | A | 11/1979 | Epstein |
| 4,615,989 | A | 10/1986 | Ritze |
| 5,173,212 | A | 12/1992 | Speit et al. |
| 5,264,286 | A | 11/1993 | Ando et al. |
| 5,478,402 | A | 12/1995 | Hanoka |
| 5,583,057 | A | 12/1996 | Inoue |
| 5,688,868 | A | 11/1997 | Fish, Jr. |
| 5,700,890 | A | 12/1997 | Chou |
| 5,741,370 | A | 4/1998 | Hanoka |
| 5,859,137 | A | 1/1999 | Chou |
| 5,866,658 | A | 2/1999 | Talkowski |
| 5,902,869 | A | 5/1999 | Chou |
| 6,075,202 | A | 6/2000 | Mori et al. |
| 6,150,028 | A | 11/2000 | Mazon |
| 6,204,443 | B1 | 3/2001 | Kiso et al. |
| 6,320,115 | B1 | 11/2001 | Kataoka et al. |
| 6,323,416 | B1 | 11/2001 | Komori et al. |
| 6,340,646 | B1 | 1/2002 | Nagashima et al. |
| 6,399,684 | B1 | 6/2002 | Talkowski |
| 6,461,736 | B1 | 10/2002 | Nagashima et al. |
| 6,468,934 | B2 | 10/2002 | Nagashima et al. |
| 6,521,825 | B2 | 2/2003 | Miura et al. |
| 6,569,947 | B1 | 5/2003 | Feinberg |
| 6,660,930 | B1 | 12/2003 | Gonsiorawski |
| 6,756,443 | B2 | 6/2004 | Feinberg |
| 6,818,819 | B2 | 11/2004 | Morizane et al. |
| 7,144,938 | B1 | 12/2006 | Feinberg et al. |
| 7,267,884 | B2 | 9/2007 | Chou et al. |
| 7,592,056 | B2 | 9/2009 | Reynoso Gomez |
| 8,057,910 | B2 | 11/2011 | Chou et al. |
| 8,062,757 | B2 | 11/2011 | Chou |
| 8,119,235 | B1 | 2/2012 | Vogel et al. |
| 8,318,316 | B2 | 11/2012 | Muckenhuber |

(Continued)

FOREIGN PATENT DOCUMENTS

| | | |
|---|---|---|
| EP | 0769818 A2 | 4/1997 |
| EP | 1182710 A1 | 2/2002 |
| EP | 2196489 A1 | 6/2010 |
| WO | 94/22172 A1 | 9/1994 |
| WO | 2008/138021 A2 | 11/2008 |
| WO | 2011/011577 A1 | 1/2011 |
| WO | 2011/094542 A2 | 8/2011 |
| WO | 2012/118518 A1 | 9/2012 |
| WO | 2014/052495 A1 | 4/2014 |

OTHER PUBLICATIONS

PCT International Search Report and Written Opinion for International Application No. PCT/US2015/027907 dated Jun. 30, 2015.

*Primary Examiner* — Gregory Listvoyb

(57) ABSTRACT

Disclosed are multilayer structures comprising polyamide-ionomer compositions suitable for use in a backsheet in a photovoltaic module comprising a polymer component comprising a polyamide and an ionomer; 0 to 20 weight % of pigment; and 0 to 40 weight % of filler; preferably wherein the combination of pigment and filler comprises 8 to 50 weight % of the composition; and 0 to 5 weight % of weatherability additives.

20 Claims, No Drawings

(56) References Cited

U.S. PATENT DOCUMENTS

| | | |
|---|---|---|
| 8,586,663 B2 | 11/2013 | Hausmann et al. |
| 2002/0055006 A1 | 5/2002 | Vogel et al. |
| 2005/0007462 A1 | 1/2005 | Koizumi |
| 2005/0020762 A1 | 1/2005 | Chou et al. |
| 2006/0142489 A1 | 6/2006 | Chou et al. |
| 2008/0097047 A1* | 4/2008 | Reynoso Gomez ............... C08L 23/0876 525/523 |
| 2008/0161503 A1 | 7/2008 | Chou et al. |
| 2009/0298372 A1 | 12/2009 | Chou et al. |
| 2010/0108126 A1 | 5/2010 | Pesek et al. |
| 2011/0020573 A1 | 1/2011 | Chou et al. |
| 2012/0196973 A1 | 8/2012 | Doshi et al. |
| 2013/0167966 A1 | 7/2013 | Chou et al. |
| 2013/0171390 A1 | 7/2013 | Chou et al. |
| 2013/0171394 A1 | 7/2013 | Chou et al. |
| 2013/0172470 A1 | 7/2013 | Chou et al. |
| 2013/0172488 A1 | 7/2013 | Chou et al. |

* cited by examiner

US 9,978,898 B2

PHOTOVOLTAIC CELLS WITH IMPROVED MULTILAYER BACKSHEET

CROSS REFERENCE TO RELATED APPLICATION

This application claims priority under 35 U.S.C. § 119(e) from U.S. Provisional Patent Application No. 61/985,576, filed Apr. 29, 2014 and U.S. Provisional Patent Application No. 61/985,579, filed Apr. 29, 2014, both hereby incorporated herein by reference in their entirety.

FIELD OF THE INVENTION

This invention relates to photovoltaic solar cell modules having an improved backsheet.

BACKGROUND OF THE INVENTION

A common form of solar cell module or photovoltaic (PV) module is made by interconnecting individually formed and separate solar cells, e.g., crystalline silicon solar cell, and then mechanically supporting and protecting the cells against environmental degradation by integrating the cells into a laminated solar cell module. The laminated modules usually comprise a stiff transparent protective front panel or sheet, and a rear panel or sheet typically called a "backsheet" or "backskin". Interconnected solar cells and an encapsulant are disposed between the front and back sheets so as to form a sandwich arrangement. A necessary requirement of the encapsulant (or at least that portion thereof that extends between the front sides of the cells and the transparent front panel) is that it be transparent to solar radiation. The typical mode of forming the laminated module is to assemble a sandwich comprising in order a transparent panel, e.g., a front panel made of glass or a transparent polymer, a front layer of at least one sheet of encapsulant, an array of solar cells interconnected by electrical conductors (with the front sides of the cells facing the transparent panel), a back layer of at least one sheet of encapsulant, a sheet of scrim to facilitate gas removal during the lamination process, and a backsheet or back panel, and then bonding those components together under heat and pressure using a vacuum-type laminator. The back layer of encapsulant may be transparent or any other color, and prior art modules have been formed using a backsheet consisting of a thermoplastic polymer, glass or some other material.

Although the lamination process seals the several layered components together throughout the full expanse of the module, it is common practice to apply a protective polymeric edge sealant to the module so as to assure that moisture will not penetrate the edge portion of the module. The polymeric edge sealant may be in the form of a strip of tape or a caulking-type compound. Another common practice is to provide the module with a perimeter frame, usually made of a metal like aluminum, to provide mechanical edge protection. Those techniques are disclosed or suggested in U.S. Pat. No. 5,741,370. That patent also discloses the concept of eliminating the back layer of encapsulant and bonding a thermoplastic backskin directly to the interconnected solar cells.

A large number of materials have been used or considered for use as the encapsulant in modules made up of individual silicon solar cells. Until at least around 1995, ethylene vinyl acetate copolymer (commonly known as "EVA") was considered the best encapsulant for modules comprising crystalline silicon solar cells. However, EVA has certain limitations: (1) it decomposes under sunlight, with the result that it discolors and gets progressively darker, and (2) its decomposition releases acetic acid which in turn promotes further degradation, particularly in the presence of oxygen and/or heat.

U.S. Pat. No. 5,478,402 discloses use of an ionomer as a cell encapsulant substitute for EVA. The use of ionomer as an encapsulant is further disclosed in U.S. Pat. No. 5,741,370. Ionomers are acid copolymers in which a portion of the carboxylic acid groups in the copolymer are neutralized to salts containing metal ions. U.S. Pat. No. 3,264,272 discloses a composition comprising a random copolymer of copolymerized units of an alpha-olefin having from two to ten carbon atoms, an alpha, beta-ethylenically-unsaturated carboxylic acid having from three to eight carbon atoms in which 10 to 90 percent of the acid groups are neutralized to salts with metal ions from Groups I, II, or III of the Periodic Table, notably, sodium, zinc, lithium, or magnesium, and an optional third mono-ethylenically unsaturated comonomer such as methyl methacrylate or butyl acrylate.

It is known to use a rear panel or backsheet that is made of the same material as the front panel, but a preferred and common practice is to make it of a different material, preferably a material that weighs substantially less than glass, such as a polyvinyl fluoride polymer available under the tradename Tedlar® from E.I. Du Pont de Nemours Co. (DuPont). A widely used backsheet material is a Tedlar®/polyester/ethylene vinyl acetate laminate. Another common backsheet uses a trilayer structure of Tedlar®/Polyester/Tedlar®, also called TPT™, described in WO 94/22172. This structure allows the fluoropolymer to protect both sides of the polyester from photo-degradation. However, Tedlar® and Tedlar® laminates are not totally impervious to moisture, and as a consequence over time the power output and/or the useful life of modules made with this kind of backsheet material is reduced due to electrical shorting resulting from absorbed moisture.

Due to the price and the supply concern, the PV industry has been gradually evaluating new alternatives, such as backsheets derived from PET, polyamides, etc. For example, WO 2008/138021 discloses PV modules with backsheets based on polyamides derived from linear and/or branched aliphatic and/or cycloaliphatic monomers, which have an average of at least 8 and most 17 carbon atoms, such as nylon 12. However, polyamides are semi-crystalline polymers with high degree of crystallinity, which can lead to brittleness, low flexibility and excessive shrinkage. High moisture absorption is especially a problem for nylon-6 and nylon-66, the most inexpensive polyamides. Water absorption causes dimensional instability, poor weatherability, and, most importantly, reduces insulation capability. While nylon-11 and nylon-12 have better moisture resistance and weatherability, the melting temperature may be too low for use in some lamination processes of PV module assembly.

U.S. Pat. No. 5,741,370 discloses using as the backskin material a thermoplastic olefin comprising a combination of two different ionomers, e.g., a sodium ionomer and a zinc second ionomer, with that combination being described as producing a synergistic effect which improves the water vapor barrier property of the backskin material over and above the barrier property of either of the individual ionomer components. The patent also discloses use of an ionomer encapsulant with the dual ionomer backskin.

It is known that thermoplastic blends or alloys based on ionomers and polyamides have a combination of desirable properties (see U.S. Pat. Nos. 4,174,358, 5,688,868, 5,866, 658, 6,399,684, 6,569,947, 6,756,443 and 7,144,938, 7,592, 056, 8,057,910, 8,062,757 and 8,119,235). For example, U.S. Pat. No. 5,866,658 discloses a blend of an ionomer dispersed in a continuous or co-continuous polyamide phase in the range of 60/40 weight % to 40/60 weight % used for molded parts exhibiting toughness, high gloss, abrasion/ scratch resistance, and high temperature properties. U.S. Pat. No. 6,399,684 discloses similar blends also containing phosphorous salts such as a hypophosphite salt. See also U.S. Patent Applications 2002/0055006, 2005/007462, 2006/0142489, 2008/0161503, 2009/0298372, 2013/0167966, 2013/0171390, 2013/0171394, 2013/0172470 and 2013/0172488.

U.S. Pat. Nos. 5,700,890, 5,859,137, 7,267,884 and U.S. Patent Application Publications 2005/0020762A1, and 2006/0142489A1 disclose polyamides toughened with ionomers of ethylene copolymers containing a monocarboxylic acid and a dicarboxylic acid or derivative thereof. U.S. Patent Application Publication 2011/0020573 discloses a blend comprising a polyamide, an ionomer of an ethylene copolymer containing a monocarboxylic acid and a dicarboxylic acid or derivative thereof, and a sulfonamide. U.S. Pat. No. 8,586,663 discloses a blend comprising a polyamide, an ionomer of an ethylene copolymer containing a monocarboxylic acid and a dicarboxylic acid or derivative thereof, and a second ionomer. U.S. Pat. No. 7,592,056 discloses blends of polyamides with mixed ion ionomers, including zinc and sodium mixtures.

U.S. Pat. No. 6,660,930 discloses photovoltaic modules comprising backskins comprising a nylon/ionomer alloy.

Photovoltaic modules can be assessed for moisture permeation and weatherability by cyclic treatment with high moisture and temperature and cold temperature in standardized "stress tests". It is desirable to provide PV modules that are capable of withstanding such stress tests for substantially more than 1000 hours. Thus, it also is desirable to provide backsheet materials that provide PV modules that are capable of withstanding such stress tests.

SUMMARY OF THE INVENTION

This invention relates to a multilayer structure comprising a polyamide-ionomer composition suitable for use as a backsheet in a photovoltaic module.

The invention provides a multilayer structure suitable for use as the backsheet in a photovoltaic module, the structure comprising at least one layer comprising or consisting essentially of a polyamide-ionomer blend composition comprising
(i) a polymer component comprising
1) 53 to 64 weight %, based on the combination of (1) and (2), of polyamide;
2) 36 to 47 weight %, based on the combination of (1) and (2), of an ionomer comprising a copolymer of copolymerized units of
   (a) ethylene;
   (b) from 2 weight % to 30 weight % of an alpha, beta-unsaturated $C_3$-$C_8$ monocarboxylic acid;
   (c) from 0 weight % to 12 weight % of at least one comonomer that is an ethylenically unsaturated dicarboxylic acid or derivative thereof selected from maleic acid, fumaric acid, itaconic acid, maleic anhydride, or a $C_1$-$C_4$ alkyl half ester of maleic acid; and
   (d) from 0 weight % to 30 weight % of monomers selected from alkyl acrylate or alkyl methacrylate, wherein the alkyl groups have from one to twelve carbon atoms; wherein the carboxylic acid functionalities present are at least partially neutralized to carboxylate salts comprising one or more alkali metal, transition metal, or alkaline earth metal cations; and
   wherein when the polyamide comprises nylon-6, the ionomer comprises from 5 weight % to 15 weight % of an alpha, beta-unsaturated $C_3$-$C_8$ carboxylic acid and from 0.5 weight % to 12 weight % of at least one comonomer that is an ethylenically unsaturated dicarboxylic acid or derivative thereof selected from maleic acid, fumaric acid, itaconic acid, maleic anhydride, or a $C_1$-$C_4$ alkyl half ester of maleic acid; and
(ii) 0 to 20 weight % of pigment;
(iii) 0 to 40 weight % of filler; preferably wherein the combination of (ii) and (iii) comprises 8 to 50 weight % of the combination of (i), (ii), (iii) and (iv); and
(iv) 0 to 5 weight % of additives selected from oxidation inhibitors, UV stabilizers and hindered amine light stabilizers.

The invention also provides a laminated solar cell module comprising or consisting essentially of a front support layer formed of a light transmitting material and having first and second surfaces; a plurality of interconnected solar cells having a first surface facing the front support layer and a second surface facing away from the front support layer; a transparent encapsulant surrounding and encapsulating the interconnected solar cells, the transparent encapsulant being bonded to the second surface of the front support layer; and a backsheet as described above wherein one surface of the backsheet is bonded to the second surface of the transparent encapsulant.

The invention also provides an assembly for conversion under heat and pressure into a laminated solar cell module, the assembly comprising a front support layer formed of a light transmitting material and having front and back surfaces; a first transparent thermoplastic encapsulant layer adjacent to the back surface of the front support layer; a plurality of interconnected solar cells having first and second surfaces adjacent to the first transparent encapsulant layer; a second transparent thermoplastic encapsulant layer disposed adjacent to the solar cells in parallel relation to the first transparent encapsulant layer; and a thermoplastic backsheet as described above.

The invention also provides a method of manufacturing a solar cell module comprising providing a front support layer formed of a light transmitting material and having front and back surfaces; placing a first transparent thermoplastic encapsulant layer adjacent to the back surface of the front support layer; positioning a plurality of interconnected solar cells having first and second surfaces so that the first surfaces thereof are adjacent to the first transparent encapsulant layer; placing a second transparent thermoplastic encapsulant layer adjacent to the second surfaces of the solar cells; placing a backsheet as described above adjacent to the second transparent thermoplastic encapsulant layer to thereby form an assembly; subjecting the assembly to heat and pressure so as to melt the encapsulant layers and cause the encapsulant to surround the solar cells, and cooling the assembly so as to cause the encapsulant to solidify and bond to the front support layer, the solar cells and the backsheet, thereby laminating the layers and the solar cells together to form an integrated solar cell module.

DETAILED DESCRIPTION OF THE INVENTION

All publications, patent applications, patents, and other references mentioned herein are incorporated by reference in their entirety.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present). As used herein, the terms "a" and "an" include the concepts of "at least one" and "one or more than one".

Unless stated otherwise, all percentages, parts, ratios, etc., are by weight. Further, when an amount, concentration, or other value or parameter is given as either a range, preferred range or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range. When a component is indicated as present in a range starting from 0, such component is an optional component (i.e., it may or may not be present). When present an optional component may be at least 0.1 weight % of the composition or copolymer.

When materials, methods, or machinery are described herein with the term "known to those of skill in the art", "conventional" or a synonymous word or phrase, the term signifies that materials, methods, and machinery that are conventional at the time of filing the present application are encompassed by this description. Also encompassed are materials, methods, and machinery that are not presently conventional, but that may have become recognized in the art as suitable for a similar purpose.

As used herein, the term "copolymer" refers to polymers comprising copolymerized units resulting from copolymerization of two or more comonomers and may be described with reference to its constituent comonomers or to the amounts of its constituent comonomers such as, for example "a copolymer comprising ethylene and 15 weight % of acrylic acid". A description of a copolymer with reference to its constituent comonomers or to the amounts of its constituent comonomers means that the copolymer contains copolymerized units (in the specified amounts when specified) of the specified comonomers.

In this application, the terms "sheet", "layer" and "film" are used in their broad sense interchangeably to describe articles wherein the compositions are processed into generally planar forms, either monolayer or multilayer. The processing method and/or the thickness may influence whether the term "sheet" or "film" is used herein, but either term can be used to describe such generally planar articles.

A "frontsheet" is a sheet, layer or film positioned as the outermost layer on the side of a photovoltaic module that faces a light source and may also be described as an incident layer. Because of its location, it is generally desirable that the frontsheet has high transparency to the desired incident light to allow efficient transmission of sunlight into the solar cells. It is also desirable that the frontsheet has high moisture barrier properties to prevent entry of moisture into the photovoltaic module. Such moisture intrusion can degrade the photovoltaic module components and/or reduce the electrical efficiency of the module.

A "backsheet" is a sheet, layer or film on the side of a photovoltaic module that faces away from a light source, and is often opaque. In some instances, it may be desirable to receive light from both sides of a device (e.g. a bifacial device), in which case a module may have transparent layers on both sides of the device.

"Encapsulant" layers are layers used to encase the fragile voltage-generating solar cell layer to protect it from damage and hold it in place in the photovoltaic module and are normally positioned between the solar cell layer and the incident layer and the backing layer. Suitable polymer materials for these encapsulant layers typically possess a combination of characteristics such as high transparency, high impact resistance, high penetration resistance, high moisture resistance, good ultraviolet (UV) light resistance, good long term thermal stability, adequate adhesion strength to frontsheets, backsheets, and other rigid polymeric sheets and cell surfaces, and good long term weatherability.

Thermoplastic resins are polymeric materials that can flow when heated under pressure. Melt index (MI) is the mass rate of flow of a polymer through a specified capillary under controlled conditions of temperature and pressure. It is typically measured according to ASTM 1238.

This invention involves the use of a polyamide-ionomer alloy in sheet form as a backsheet material. As used herein, the term "alloy" is used to describe a polymer blend that forms a distinct polymer substance.

The polyamide-ionomer blend may comprise, consist essentially of consist of or be produced from, a polyamide in an amount from a lower limit of 53, 58 or 60 weight % to an upper limit of 64 weight % and an ionomer in an amount from a lower limit of 36 or 40 weight % to an upper limit of 42, or 47 weight %, all based on the weight of the combination of polyamide and ionomer.

Polyamides (abbreviated herein as PA), also referred to as nylons, are condensation products of one or more dicarboxylic acids and one or more diamines, and/or one or more aminocarboxylic acids such as 11-aminododecanoic acid, and/or ring-opening polymerization products of one or more cyclic lactams such as laurolactam. Polyamides used in the compositions described herein may be fully aliphatic or semiaromatic, provided they have at least one repeat unit having seven or more carbon atoms.

Polyamides from single reactants such as lactams or amino acids, referred to as AB type polyamides are disclosed in *Nylon Plastics* (edited by Melvin L. Kohan, 1973, John Wiley and Sons, Inc.) and include nylon-11, nylon-12, or combinations of two or more thereof. Polyamides prepared from more than one lactam or amino acid include nylon-6, 12.

Other well-known polyamides useful in the composition include those prepared from condensation of diamines and diacids, referred to as AABB type polyamides (including nylon-610, nylon-612, nylon-1010, and nylon-1212), as well as from a combination of lactams, diamines and diacids such as nylon-6/610, nylon-6/66/610, nylon-66/610, or combinations of two or more thereof.

Fully aliphatic polyamides used in the composition are formed from aliphatic and alicyclic monomers such as diamines, dicarboxylic acids, lactams, aminocarboxylic acids, and their reactive equivalents. In this context, the term "fully aliphatic polyamide" also refers to copolymers derived from two or more such monomers and blends of two or more fully aliphatic polyamides. Linear, branched, and cyclic monomers may be used.

Carboxylic acid monomers comprised in the fully aliphatic polyamides include, but are not limited to aliphatic dicarboxylic acids, such as for example adipic acid (C6), pimelic acid (C7), suberic acid (C8), azelaic acid (C9), decanedioic acid (C10), dodecanedioic acid (C12), tridecanedioic acid (C13), tetradecanedioic acid (C14), and pentadecanedioic acid (C15). Diamines can be chosen among diamines with four or more carbon atoms, including but not limited to tetramethylene diamine, hexamethylene diamine, octamethylene diamine, decamethylene diamine, dodecamethylene diamine, 2-methylpentamethylene diamine, 2-ethyltetramethylene diamine, 2-methyloctamethylenediamine; trimethylhexamethylenediamine, meta-xylylene diamine, and/or mixtures thereof.

Semi-aromatic polyamides include a homopolymer, a copolymer, a terpolymer or more advanced polymers formed from monomers containing aromatic groups. One or more aromatic carboxylic acids may be terephthalic acid or a mixture of terephthalic acid with one or more other carboxylic acids, such as isophthalic acid, phthalic acid, 2-methyl terephthalic acid and naphthalic acid. In addition, the one or more aromatic carboxylic acids may be mixed with one or more aliphatic dicarboxylic acids, as disclosed above. Alternatively, an aromatic diamine such as meta-xylylene diamine (MXD) can be used to provide a semi-aromatic polyamide, an example of which is MXD6, a homopolymer comprising MXD and adipic acid.

Preferred polyamides disclosed herein are homopolymers or copolymers wherein the term copolymer refers to polyamides that have two or more amide and/or diamide molecular repeat units. The homopolymers and copolymers are identified by their respective repeat units. For copolymers disclosed herein, the repeat units are listed in decreasing order of mole % repeat units present in the copolymer. The following list exemplifies the abbreviations used to identify monomers and repeat units in the homopolymer and copolymer polyamides:

HMD hexamethylene diamine (or 6 when used in combination with a diacid)
T Terephthalic acid
ε-Caprolactam
AA Adipic acid
DDA Decanedioic acid
DDDA Dodecanedioic acid
I Isophthalic acid
MXD meta-xylylene diamine
TMD 1,4-tetramethylene diamine
6T polymer repeat unit formed from HMD and T
MXD6 polymer repeat unit formed from MXD and AA
66 polymer repeat unit formed from HMD and AA
610 polymer repeat unit formed from HMD and DDA
612 polymer repeat unit formed from HMD and DDDA
11 polymer repeat unit formed from 11-aminoundecanoic acid
12 polymer repeat unit formed from 12-aminododecanoic acid In the art the term "6" when used alone designates a polymer repeat unit formed from ε-caprolactam. Alternatively "6" when used in combination with a diacid such as T, for instance 6T, the "6" refers to HMD. In repeat units comprising a diamine and diacid, the diamine is designated first. Furthermore, when "6" is used in combination with a diamine, for instance 66, the first "6" refers to the diamine HMD, and the second "6" refers to adipic acid. Likewise, repeat units derived from other amino acids or lactams are designated as single numbers designating the number of carbon atoms.

In various embodiments the polyamide comprises one or more polyamides selected from among the following groups (wherein PA is shorthand for polyamide or "nylon"):

Group I polyamides have a melting point of less than 210° C., and comprise an aliphatic or semiaromatic polyamide such as poly(hexamethylene dodecanediamide/hexamethylene terephthalamide) (PA612/6T). See PCT Patent Application Publication WO2011/94542. Group I polyamides may have semiaromatic repeat units to the extent that the melting point is less than 210° C. and generally the semiaromatic polyamides of the group have less than 40 mole percent of semiaromatic repeat units. Semiaromatic repeat units are defined as those derived from monomers selected from one or more of the group consisting of aromatic dicarboxylic acids having 8 to 20 carbon atoms and aliphatic diamines having 4 to 20 carbon atoms. Other notable Group I polyamides include PA6/610, PA6/66/610, PA6/6T, PA1010, PA11 and PA12.

Group II polyamides have a melting point of at least 210° C. and comprise an aliphatic polyamide. Notable Group II polyamides include PA610 and PA612.

Group III polyamides have a melting point of at least 210° C. and comprise
(aa) 20 to 35 mole percent semiaromatic repeat units derived from one or more monomers selected from
(i) aromatic dicarboxylic acids having 8 to 20 carbon atoms and aliphatic diamines having 4 to 20 carbon atoms; and
(bb) 65 to 80 mole percent aliphatic repeat units derived from one or more monomers selected from
(ii) an aliphatic dicarboxylic acid having 6 to 20 carbon atoms and an aliphatic diamine having 4 to 20 carbon atoms; and
(iii) a lactam and/or aminocarboxylic acid having 4 to 20 carbon atoms.

A preferred Group III polyamide is PA66/6T.

Group IV polyamides have a melting point of greater than 230° C. and comprise
(cc) 50 to 95 mole percent semiaromatic repeat units derived from one or more monomers selected from
(i) aromatic dicarboxylic acids having 8 to 20 carbon atoms and aliphatic diamines having 4 to 20 carbon atoms; and
(dd) 5 to 50 mole percent aliphatic repeat units derived from one or more monomers selected from
(ii) an aliphatic dicarboxylic acid having 6 to 20 carbon atoms and said aliphatic diamine having 4 to 20 carbon atoms; and
(iii) a lactam and/or aminocarboxylic acid having 4 to 20 carbon atoms.

A preferred Group IV polyamide is PA6T/66.

Group V polyamides have a melting point of at least 260° C. and comprise
(ee) greater than 95 mole percent semiaromatic repeat units derived from one or more monomers selected from
(i) aromatic dicarboxylic acids having 8 to 20 carbon atoms and aliphatic diamines having 4 to 20 carbon atoms; and
(ff) less than 5 mole percent aliphatic repeat units derived from one or more monomers selected from
(ii) an aliphatic dicarboxylic acid having 6 to 20 carbon atoms and said aliphatic diamine having 4 to 20 carbon atoms; and (iii) a lactam and/or aminocarboxylic acid having 4 to 20 carbon atoms.

A preferred Group V Polyamide is PA6T/DT.

Group VI polyamides have no melting point and include poly(hexamethylene isophthalamide/hexamethylene terephthalamide) (PA6I/6T) and poly(hexamethylene isophthalamide/hexamethylene terephthalamide/hexamethylene hexanediamide) (PA6I/6T/66).

In various embodiments the polyamide is a Group I polyamide, Group II polyamide, Group III polyamide, Group IV polyamide, Group V polyamide or Group VI polyamide, respectively.

Preferred polyamides include PA610, PA612, PA6/610, PA6/66/610, PA6/6T, PA610/6T, P612/6T, PA1010, PA11, PA12 and combinations thereof. More preferred polyamides include PA610, PA612, PA610/6T, PA612/6T, PA1010, PA11, PA12 and combinations thereof, including most preferably PA612, P612/6T or PA12 or combinations thereof.

The polyamide component may be a blend of two or more polyamides. Preferred blends include those selected from the group consisting of Group I and Group II polyamides, Group I and Group III polyamides, Group I and Group VI polyamides, Group II and Group III polyamides, Group II and Group IV polyamides, Group II and Group V polyamides, Group II and Group VI polyamides, Group III and Group VI polyamides, and Group IV and Group V polyamides. A notable blend is a blend of PA612 and PA612/6T, especially in a blend ratio of 1:3 of PA612:PA612/6T. See U.S. Patent Application Publication 2012/0196973.

Polyamides and processes for making them are well known to those skilled in the art, so the disclosure of which is omitted in the interest of brevity.

The polyamide may have a relative viscosity (RV) of 2.5 to 4.0, preferably from 2.6 to 3.5. Relative viscosity is related to melt viscosity. Varied methods may be used for measured RV values, and not all commercial polyamides list the RV values. RV is determined by comparing the time required for a specific volume of polymer solution to flow through a capillary tube with the corresponding flow time of the same volume of pure solvent. Different solvents may be used, depending on the polyamide of interest. Common solvents include 96% sulfuric acid and 90% formic acid.

As indicated above, this invention provides a backsheet for a PV module comprising a thermoplastic composition comprising a polyamide and an ionomeric composition comprising a copolymer of ethylene, an $\alpha,\beta$-unsaturated $C_3$-$C_8$ monocarboxylic acid.

Ionomeric resins ("ionomers") are ionic copolymers of an olefin such as ethylene (E) with a metal salt of an unsaturated carboxylic acid, such as acrylic acid (AA), methacrylic acid (MAA), and/or other acids, and optionally softening comonomers. At least one alkali metal, transition metal, or alkaline earth metal cation, such as lithium, sodium, potassium, magnesium, calcium, or zinc, or a combination of such cations, is used to neutralize some portion of the acidic groups in the copolymer resulting in a thermoplastic resin exhibiting enhanced properties. For example, a copolymer of ethylene and acrylic acid can then be at least partially neutralized to salts comprising one or more alkali metal, transition metal, or alkaline earth metal cations to form an ionomer. Copolymers can also be made from an olefin such as ethylene, an unsaturated carboxylic acid and other comonomers such as alkyl (meth)acrylates providing "softer" resins that can be neutralized to form softer ionomers.

Dipolymers preferably include from 8 to 20 weight % of monocarboxylic acid. For example, a dipolymer of ethylene and methacrylic acid can then be at least partially neutralized to salts comprising one or more alkali metal, transition metal, or alkaline earth metal cations to form an ionomer.

Ionomers useful in this invention also consist of a family of ionomers containing dicarboxylic acid moieties that can be derived from ethylenically unsaturated derivatives of dicarboxylic acid comonomers, such as maleic anhydride and ethyl hydrogen maleate, at least partially neutralized by one or more alkali metal, transition metal, or alkaline earth metal cations (denoted as anhydride ionomers). They are copolymers comprising copolymerized units of ethylene, an $\alpha,\beta$-unsaturated $C_3$-$C_8$ carboxylic acid and at least one comonomer that is an ethylenically unsaturated dicarboxylic acid at an amount of from 0.5 weight % to 12 weight %, alternatively from 3 weight % to 12 weight %. Preferably, the dicarboxylic acid comonomer(s) are present in an amount from 4 weight % to 10 weight %. The unsaturated dicarboxylic acid comonomers or their derivatives can be selected from, for example, maleic anhydride (MAH), ethyl hydrogen maleate (also known as maleic acid monoethylester or MAME), and itaconic acid (ITA). More preferably, a copolymer comprises from 4 to 8 weight % of maleic acid monoethylester comonomer in an ethylene/methacrylic acid/maleic acid monoethylester copolymer wherein from 20 to 70 percent of the total acid groups in the copolymer are neutralized to provide carboxylate salts containing alkali metal, transition metal, or alkaline earth metal cations.

Notably, when the polyamide is poly(caprolactam) (nylon-6), the ionomer component comprises an anhydride ionomer.

Some non-neutralized ethylene acid copolymers comprising lower amounts of ethylenically unsaturated dicarboxylic acid comonomers are known (see U.S. Pat. No. 5,902,869), as are their ionomeric derivatives (see U.S. Pat. No. 5,700,890).

As indicated above, comonomers such as alkyl (meth)acrylates can be included in the ethylene acid copolymer to form a copolymer that can be neutralized to provide carboxylate salts with alkali metal, alkaline earth metal or transition metal cations. Preferred are comonomers selected from alkyl acrylate and alkyl methacrylate wherein the alkyl groups have from 1 to 8 carbon atoms, and more preferred are comonomers selected from methyl acrylate, ethyl acrylate, iso-butyl acrylate (iBA), and n-butyl acrylate (nBA). The alkyl (meth)acrylates are optionally included in amounts from 0 to 30 weight % alkyl (meth)acrylate such as 0.1 to 30 weight % when present and preferably from 0.1 to 15 weight % of the copolymer.

Examples of copolymers useful in this invention include copolymers of ethylene, methacrylic acid and ethyl hydrogen maleate (E/MAA/MAME) and copolymers of ethylene, acrylic acid and maleic anhydride (E/AA/MAH).

Neutralization of the ethylene acid copolymer can be effected by first making the ethylene acid copolymer and treating the copolymer with inorganic base(s) with alkali metal, alkaline earth metal or transition metal cation(s). The copolymer can be from 10 to 99.5% neutralized with at least one metal ion selected from lithium, sodium, potassium, magnesium, calcium, barium, lead, tin, zinc, aluminum; or combinations of such cations. Neutralization may be from 10 to 70%. Preferably the copolymer has from 20%, alternatively from 35%, to 70% of the available carboxylic acid groups ionized by neutralization with at least one metal ion selected from sodium, zinc, lithium, magnesium, and calcium; such as wherein the carboxylic acid functionalities present are at least partially neutralized to carboxylate salts comprising zinc or sodium, preferably zinc. Of particular note is an ionomer comprising zinc as the neutralizing cation.

Mixed metal ionomers may provide a combination of better properties to the blends with polyamides than ionomers comprising a single type of cation. For example, a zinc/sodium mixed ion ionomer blended with polyamide may provide lower water sorption, better scratch resistance and better processing capability than those provided by a corresponding ionomer containing only an alkali metal such as sodium. The zinc/sodium mixed ion ionomer may also provide higher hardness and higher mechanical strength than provided by a corresponding ionomer containing only zinc. Mixed ion ionomers are conveniently prepared by blending an ionomer composition with a single cation, such as a zinc-containing ionomer, with an ionomer with a different cation, such as a sodium-containing ionomer. Alternatively, mixed ion ionomers may be prepared by neutralizing an acid copolymer with different neutralizing agents, either sequentially or simultaneously.

Methods for preparing ionomers from copolymers are well known in the art.

Non-limiting, illustrative examples of ionomers include E/15MAA/Na, E/19MAA/Na, E/15AA/Na, E/19AA/Na, E/15MAA/Mg, E/19MAA/Li, and E/15MAA/60Zn (wherein E represents ethylene, MAA represents methacrylic acid, AA represents acrylic acid, the numbers represents either the weight % of comonomer(s) present in the copolymer or the amount of neutralization of the available carboxylic acid groups, and the atomic symbol represents the neutralizing cation).

Depending on the need of a particular application, the amount of ionomer or mixture of ionomers in component (2) can be manipulated to provide an appropriate balance of toughness, low temperature impact strength and resistance to hydrolytic delamination.

The polyamide-ionomer blend further contains 0 to 20 weight % of pigment; and 0 to 40 weight % of filler; such that the pigment and/or filler comprises 8 to 50 weight % of the total composition.

As used herein pigments have refractive indices greater than 1.8, preferably greater than 2, and particle size less than 0.5 microns such as 0.2 to 0.4 microns. The compositions may comprise inorganic pigments such as oxide pigments, e.g., titanium dioxide, zinc oxide, and antimony oxide. Other pigments include lithophone, chromomolybdic acid, sulfide pigments, selenium compound, ferrocyanide and carbon black pigments. Notably, the pigment comprises titanium dioxide, zinc oxide, or antimony oxide, preferably titanium dioxide. The compositions containing inorganic pigments maintain good flowability and color the molded article even when used in a small amount.

As used herein fillers have refractive indices of 1.6 or less and particle size of 0.8 micron or greater. Suitable fillers include mineral fillers such as inorganic oxides, carbonates, sulfates, silicas, alkali and alkaline earth metal silicates, and barytes of a metal of Groups IA, IIA, IIIA, IIB, VIB or VIII of the periodic table of the elements, including magnesium silicates such as talc ($Mg_3Si_4O_{10}(OH)_2$), wollastonite ($CaSiO_3$), phyllosilicates (mica) and calcium carbonate. Preferred fillers include calcium carbonate, barium sulfate, wollastonite or talc, more preferably talc. Fillers may optionally be coated such as with silane treatments to improve wetting between the filler and the polymer matrix. The shape, size, and size distribution of the filler all impact its effectiveness as filler, though, at high levels, the particular characteristics of the filler become less important. Preferably the filler particles have a ratio of the largest dimension to the smallest dimension greater than 5. Fillers also include glass fibers. Desirably, fillers provide stiffening (improving Young's modulus ASTM D882) and reduce the coefficient of linear thermal expansion (ASTM E831) for the composition while maintaining good elongation to break (ASTM D882). Large particles such as those having a particle size in at least one dimension greater than 200 microns such as mica or glass fibers provide good stiffening but can reduce elongation to break. Particles with at least one dimension less than 20 microns or less than 5 microns are preferred. Talc (platelike fillers) and Wollastonite (rodlike fillers) provide for minimizing co-efficient of linear thermal expansion and maximizing stiffness, while still maintaining a reasonable amount of elongation to break. Preferably the fillers are either transparent, such as glass fibers, or white to produce whiter compositions. For example, talc commercially available as Jetfine® 3CA is whiter than Jetfine® 3CC, which when incorporated into the polymer matrix leads to a whiter composition. This is particularly desirable when used in combination with a white pigment such as titanium dioxide.

For example but not limitation, the composition may comprise 8 to 20 weight % of pigment such as $TiO_2$ and 0 weight % filler, or the composition may comprise 8 to 40 weight % of filler such as talc and 0 weight % of pigment, or the composition may comprise 10 to 40 weight % of filler such as talc and 8 to 15 weight % of pigment. Notable compositions comprise or include 8 to 12 weight % of pigment and 12 to 18 weight % of filler such as 10 weight % of pigment and 15 weight % of filler.

The polyamide-ionomer blend may further contain additional additives that provide weatherability, stability or improved processing. The polyamide-ionomer composition or blend can comprise 0.1 to 5 weight % of optional additives, based on the weight of the total composition. Such additives include stabilizers, antioxidants, ultraviolet ray absorbers, hydrolytic stabilizers, antistatic agents, fire-retardants, processing aids such as lubricants, antiblock agents, release agents, or combinations of two or more thereof. Of particular note are oxidation inhibitors (antioxidants), UV stabilizers and hindered amine light stabilizers. The relative percentages of these additives may be varied depending upon the particular use of the object desired. The additives can be added to the polymer blend in typical melt compounding equipment.

Suitable stabilizers include antioxidants, such as the IRGANOX® family produced by Ciba-Geigy (now a part of BASF), and UV stabilizers such as those sold under the TINUVIN® tradename by Ciba-Geigy or CYASORB® light stabilizer and light absorber produced by Cytec. Preferred antioxidants are based on hindered phenols, and preferred UV stabilizers are based on hindered amine light stabilizers (HALS) such as those sold under the Chimassorb® tradename from BASF.

Lubricants of note include salts of fatty acids such as sodium stearate or zinc stearate, which may be added at 0.1 to 1 weight % of the total composition.

The blend may also contain phosphorous salts such as a hypophosphite salt. Suitable phosphorous salts for use in the blends are described in greater detail in U.S. Pat. No. 6,399,684. The salts, including sodium, lithium, or potassium hypophosphite may be added to the blend composition in 0.1 to 3 weight % of the composition. Hypophosphite salts may provide improved morphological or physical properties to the blend such as increased Vicat temperature and/or improved tensile properties. Of note is a composition as described herein consisting essentially of (1) a polyamide as described above; (2) an ionomer as described above; and (3) hypophosphite salt.

The polymeric blend composition may be mixed with pigment, filler and/or additional additives using well known melt mixing methods employing extruders or other suitable mixers such as Banbury or Farrel continuous mixers or roll mills.

Once the polyamide-ionomer blends are prepared as described above, they can be further processed into monolayer or multilayer structures useful as a backsheet for a photovoltaic module. Molten extruded thermoplastic compositions can be converted into film or sheet using any techniques known to one skilled in the art. Suitable additional processes include without limitation blown film extrusion, cast film extrusion, cast sheet extrusion, lamination, coextrusion, extrusion coating, and the like. A notable multilayer backsheet structure may comprise a layer comprising a blend of polyethylene and ionomer adjacent to the encapsulant layer of the photovoltaic module.

A film or sheet can be further oriented beyond its immediate quenching or casting. The process comprises the steps of (co)extruding a laminar flow of molten polymers, quenching the (co)extrudate and orienting the quenched (co)extrudate in at least one direction. The film may be uniaxially oriented, or it can be biaxially oriented by drawing in two mutually perpendicular directions in the plane of the film to achieve a satisfactory combination of mechanical and physical properties. Orientation and stretching are well known to one skilled in the art and the description of which is omitted herein for the interest of brevity.

For multilayer structures, the layers may be coextruded or they may be formed independently and then adhesively attached to one another to form the backsheet. A backsheet can be made by (co)extrusion optionally followed by lamination onto one or more other layers. The backsheet may be fabricated by extrusion coating or laminating some or all of the layers onto a substrate. For example, a sheet or film of a core layer may be produced, to which skin layers and optional tie layers are adhered. Some back-sheet structures contain "e-layers" or layers that have a special affinity to adhere to the encapsulant. The e-layers can be co-extruded, or laminated to the subject back-sheet composition through the use of a coextrudable adhesive. However, additional "e-layers" are not required to be coated or laminated onto the instant backsheet structures. The polyamide-ionomer alloys that comprise the backsheet have strong adhesion to encapsulant layers, such as the standard commercial EVA encapsulant materials without additional "e-layers". Other notable multilayer structures include inner skin layers adjacent to the encapsulant layers that comprise a polyamide-ionomer blend composition, an ionomer, polyethylene, an ionomer-polyethylene blend or an ethylene vinyl acetate copolymer optionally or preferably comprising about 10 to about 20 weight % of inorganic pigment.

A sheet could be further processed by thermoforming into a shaped article. In thermoforming, a flat sheet is heated above its softening point and stretched to the desired shape. For example, a sheet comprising the polyamide-anhydride ionomer composition could be thermoformed into a shape that conforms to the shape of the photovoltaic elements in the photovoltaic cell.

For use as a backsheet in a photovoltaic module, the thickness of the sheet is 8 to 20 mils (200 to 500 microns).

A laminated solar cell module of the invention comprises or consists essentially of a frontsheet providing a front support layer formed of a light transmitting material and having first and second surfaces; a plurality of interconnected solar cells having a first surface facing the front support layer and a second surface facing away from the front support layer; a transparent encapsulant surrounding and encapsulating the interconnected solar cells, the transparent encapsulant being bonded to the second surface of the front support layer; and a backsheet as described above wherein the one surface of the backsheet is bonded to the second surface of the transparent encapsulant.

The frontsheet or incident layer may be derived from any suitable sheets or films. Suitable sheets may be glass or polymeric sheets, such as those comprising a polymer selected from polycarbonates, acrylics, polyacrylates, cyclic polyolefins (e.g., ethylene norbornene polymers), polystyrenes (preferably metallocene-catalyzed polystyrenes), polyamides, polyesters, fluoropolymers, or combinations of two or more thereof.

The term "glass" includes not only window glass, plate glass, silicate glass, sheet glass, low iron glass, tempered glass, tempered CeO-free glass, and float glass, but also colored glass, specialty glass (such as those containing ingredients to control solar heating), coated glass (such as those sputtered with metals (e.g., silver or indium tin oxide) for solar control purposes), E-glass, Toroglass, Solex® glass (PPG Industries, Pittsburgh, Pa.) and Starphire® glass (PPG Industries). Such specialty glasses are disclosed in, e.g., U.S. Pat. Nos. 4,615,989; 5,173,212; 5,264,286; 6,150,028; 6,340,646; 6,461,736; and 6,468,934. It is understood, however, that the type of glass to be selected for a particular module depends on the intended use.

For example, fluoropolymer films, such as ethylene-tetrafluoroethylene copolymer (ETFE) films, may be used as frontsheets in photovoltaic modules instead of the more common glass layers. Another alternative is a film made from a perfluorinated copolymer resin such as a tetrafluoroethylene-hexafluoropropylene copolymer (FEP).

The light-receiving side of the solar cell layer may sometimes be referred to as a front side and in actual use conditions would generally face a light source. The non-light-receiving side of the solar cell layer may sometimes be referred to as a lower or back side and in actual use conditions would generally face away from a light source.

Monocrystalline silicon (c-Si), poly- or multi-crystalline silicon (poly-Si or mc-Si) and ribbon silicon are the materials used most commonly in forming the more traditional wafer-based solar cells. Photovoltaic modules derived from wafer-based solar cells often comprise a series of self-supporting wafers (or cells) that are soldered together. The wafers generally have a thickness of between 180 and 240 µm.

The solar cell layer may be significantly thicker than the other layers and irregular in shape and/or thickness, including spaces between and around the solar cells and other components of the solar cell layer. In this connection, it should be noted that the conductors that interconnect the solar cells commonly are arranged to form stress relief loops to compensate for expansion and contraction caused by temperature changes. Those loops need to be encapsulated with the cells. However, when a polymeric backsheet is used, care must be taken to make certain that the stress loops will not pierce the backsheet when the several layers are compressed under heat to form the laminated module. Penetration of the backsheet by one or more stress loops will promote early failure of the module, e.g., by short-circuiting resulting from ingress of moisture at the point(s) of stress loop penetration the backsheet.

Therefore, portions of the backsheet laminate will contact the encapsulant layer outside the perimeter of the solar cell layer and can be adhered when heat is applied. As used herein, the perimeter of the solar cell layer is the outline of the outer limits of the area encompassed by the solar cell layer. In many cases, it is desirable that the encapsulant material flows into the spaces and closely encapsulates the solar cells and other components to physically consolidate the photovoltaic module. Thus, it may be necessary to apply heat for a period of time sufficient to allow such flow, which may be longer than that needed for adhering thinner layers of a more regular shape. For example, heat may be applied in such a manner that the assembly is maintained above the softening point of the encapsulant layer for 5 to 30 minutes to effectively consolidate the photovoltaic module.

The encapsulant layers used in preparing photovoltaic modules described herein may each comprise a polymeric material independently selected from olefin unsaturated carboxylic acid copolymers, ionomers of olefin unsaturated carboxylic acid copolymers, ethylene vinyl acetate copolymers, poly(vinyl acetals) (including acoustic grade poly(vinyl acetals)), polyurethanes, polyvinylchlorides, polyethylenes (e.g., linear low density polyethylenes), polyolefin block copolymer elastomers, copolymers of α-olefins and ethylenically unsaturated carboxylic acid esters (e.g., ethylene methyl acrylate copolymers and ethylene butyl acrylate copolymers), silicone elastomers, epoxy resins, or combinations of two or more thereof.

The encapsulant layer may preferably comprise a thermoplastic polymer including ethylene vinyl acetate copolymers, olefin unsaturated carboxylic acid copolymers, ionomers of olefin unsaturated carboxylic acid copolymers, and combinations thereof (for example, a combination of two or more olefin unsaturated carboxylic acid copolymers, a combination of two or more ionomers of olefin unsaturated carboxylic acid copolymers, or a combination of at least one unsaturated carboxylic acid copolymer with one or more ionomers of unsaturated carboxylic acid copolymers).

The solar cell module and assembly to prepare it may optionally further comprise other functional film or sheet layers (e.g., dielectric layers or barrier layers) embedded within the module. Such functional layers may be derived from any of the above-mentioned polymeric films or those that are coated with additional functional coatings. For example, poly(ethylene terephthalate) films coated with a metal oxide coating, such as those disclosed in U.S. Pat. Nos. 6,521,825 and 6,818,819 and European Patent EP 1182710, may function as oxygen and moisture barrier layers in the laminates.

If desired, a layer of nonwoven glass fiber (scrim) may also be included between the solar cell layers and the encapsulants to facilitate deaeration during the lamination process or to serve as reinforcement for the encapsulants. The use of such scrim layers is disclosed in, e.g., U.S. Pat. Nos. 5,583,057; 6,075,202; 6,204,443; 6,320,115; and 6,323,416 and European Patent EP0769818.

In addition, metal films, such as aluminum foil or metal sheets, such as aluminum, steel, galvanized steel, or ceramic plates may be utilized in addition to the polymeric backsheet described herein as backing layers for the photovoltaic module.

A special film or sheet may be included to serve both the function of an encapsulant layer and an outer layer. It is also conceivable that any of the film or sheet layers included in the module may be in the form of a pre-formed single-layer or multilayer film or sheet.

If desired, one or both surfaces of the incident layer films and sheets, the backsheet films and sheets, the encapsulant layers and other layers incorporated within the solar cell module may be treated prior to the lamination process to enhance the adhesion to other laminate layers. This adhesion enhancing treatment may take any form known in the art and includes those set forth in U.S. Patent Application Publication 2010/0108126.

Manufacturing the solar cell module comprises providing a front support layer formed of a light transmitting material and having front and back surfaces; placing a first transparent thermoplastic encapsulant layer adjacent to the back surface of the front support layer; positioning a plurality of interconnected solar cells having first and second surfaces so that the first surfaces thereof are adjacent to the first transparent encapsulant layer; placing a second transparent thermoplastic encapsulant layer adjacent to the second surfaces of the solar cells; placing a backsheet as described above adjacent to the second transparent thermoplastic encapsulant layer to thereby form an assembly; subjecting the assembly to heat and pressure so as to melt the encapsulant layers and cause the encapsulant to surround the solar cells, and cooling the assembly so as to cause the encapsulant to solidify and bond to the front support layer, the solar cells and the backsheet, thereby laminating the layers and the solar cells together to form an integrated solar cell module.

The photovoltaic module is prepared by providing an assembly for conversion under heat and pressure into a laminated solar cell module, the assembly comprising a front support layer formed of a light transmitting material and having front and back surfaces; a first transparent thermoplastic encapsulant layer adjacent to the back surface of the front support layer; a plurality of interconnected solar cells having first and second surfaces adjacent to the first transparent encapsulant layer; a second transparent thermoplastic encapsulant layer disposed adjacent to the solar cells in parallel relation to the first transparent encapsulant layer; and a thermoplastic backsheet layer as described above.

A vacuum laminator may be used to adhere the layers of the assembly together to provide the photovoltaic module. The laminator comprises a platen base, on which the layers of the assembly are placed in overlaying fashion for lamination. The laminator also comprises an enclosure that covers and completely surrounds the platen base. The region enclosed by the platen and enclosure may be evacuated. The laminator also comprises a flexible bladder within the enclosure attached to the top inner surface of the enclosure, which may be inflated to a pressure greater than the pressure in the evacuated region. For example, the pressure above the bladder may be atmospheric and the laminate may be held under vacuum beneath the bladder to remove air. When the bladder is inflated, the flexible surface of the bladder is pushed from the top of the enclosure toward the platen and applies a surface pressure to the multilayer assembly to ensure a good thermal contact between the assembly and the platen. For lamination of the module, the laminator is preheated to a temperature above the softening temperature of the encapsulant layer(s) and held at that temperature throughout the lamination process.

Heat-resistant sheets may be placed under the assembly to retard heat flow and allow deaeration and devolatilization of the sample. Release sheets may be placed under the and/over the assembly to prevent the sample layers from adhering to parts of the laminator. The assembly is placed on the platen and the enclosure of the laminator is lowered into place and sealed. Next, the region surrounding the assembly between the platen and enclosure of the laminator is evacuated (e.g.

to a pressure of 1 mbar) to help further with the prevention of voids, defects, and air pockets. Next, the rubber bladder is inflated (e.g. to a pressure of 999 mbar) so that it presses against the assembly and ensures good thermal contact with the platen. The pressure and heat are maintained for a sufficient period of time (for 1 to 10 minutes) to soften the encapsulant layers and adhere to solar cells and the adjoining layers.

When the heating step is complete, the bladder is depressurized to 0 mbar so that it may be removed from contact with the multilayer film laminate, the enclosure is vented to atmospheric pressure and the enclosure is unsealed and opened. The multilayer film laminate is removed from the platen and allowed to cool to room temperature.

The lamination methodology described here is by no means the only possible way to carry out such laminations. For example, more advanced laminators have retractable pins that hold the multilayer laminate structure above the heat source until the desired time to effect contact and heating. This would obviate the need for heat resistant layers in most cases.

Embodiments of the multilayer structure include:

The multilayer structure comprising
an outer skin layer comprising the polyamide-ionomer blend composition of claim 1;
an interior core layer comprising polyamide or a blend of ionomer and polyamide, optionally filled with about 10 to about 30 weight % of inorganic filler;
an inner skin layer comprising a polyamide-ionomer blend composition, an ionomer, polyethylene, an ionomer-polyethylene blend or an ethylene vinyl acetate copolymer optionally comprising about 10 to about 20 weight % of inorganic pigment; and optionally
one or more tie layers positioned between the core layer and the outer skin layer, between the core layer and the inner skin layer, or between the core layer and each of the skin layers. In these embodiments, the polyethylene or the ionomer-polyethylene blend may independently comprise low density polyethylene, linear low density polyethylene, or high density polyethylene, preferably high density polyethylene. Also, the interior core layer preferably comprises about 10 to about 20 weight % of inorganic filler. Also, the inner skin layer preferably comprises about 10 to about 20 weight % of inorganic pigment.

The multilayer structure wherein the polyamide in each of the layers is independently selected from nylon-6, nylon-11, nylon-12, nylon-66, nylon-6,10, nylon-6,12, nylon-610/6T, nylon-612/6T, nylon-6/66, nylon-6/610, nylon-6/66/610, nylon-6/6T, nylon-1010, nylon-11 and nylon-12, nylon-66/6T, nylon-6T/DT, nylon-6I/6T, nylon-6I/6T/66, or combinations thereof.

The multilayer structure wherein the polyamide in each of the layers is independently selected from nylon-6, nylon-66, nylon-610, nylon-612, nylon-6/66, nylon-6/610, nylon-6/66/610, nylon-6/6T, nylon-610/6T, nylon-12/6T, nylon-1010, nylon-11, nylon-12 or combinations thereof.

The multilayer structure wherein the polyamide in each of the layers is nylon-6 and the ionomer comprises an acid copolymer comprising from 5 weight % to 15 weight % of an alpha, beta-unsaturated $C_3$-$C_8$ carboxylic acid and from 0.5 weight % to 12 weight % of at least one comonomer that is an ethylenically unsaturated dicarboxylic acid or derivative thereof selected from maleic acid, fumaric acid, itaconic acid, maleic anhydride, or a $C_1$-$C_4$ alkyl half ester of maleic acid; wherein the carboxylic acid functionalities present are at least partially neutralized to carboxylate salts comprising one or more alkali metal cations.

The multilayer structure wherein the polyamide-ionomer blend composition comprises 10 to 40 weight % of filler and 8 to 15 weight % of pigment.

The multilayer structure wherein the polyamide-ionomer blend composition comprises 8 to 12 weight % of pigment and 12 to 18 weight % of filler.

The multilayer structure wherein the pigment comprises titanium dioxide, zinc oxide, or antimony oxide.

The multilayer structure wherein the filler comprises an inorganic oxide, carbonate, sulfate, silica, alkali and alkaline earth metal silicate, or baryte of a metal of Groups IA, IIA, IIIA, IIB, VIB or VIII of the periodic table of the elements.

The multilayer structure wherein one or more tie layer is present and each tie layer independently comprises a maleic anhydride-grafted polymer selected from maleated linear low density polyethylene, maleated polypropylene, maleated styrene-ethylene-butene-styrene triblock copolymer, maleated ethylene vinyl acetate copolymers or maleated polybutadiene; or
a copolymer comprising ethylene copolymerized with a functional comonomer comprising an ethylenically unsaturated dicarboxylic acid or derivative thereof.

The multilayer structure wherein the inner skin layer comprises a polyamide-ionomer blend composition or an ionomer-high density polyethylene blend optionally filled with about 10 to about 20 weight % of inorganic pigment; and comprising at least one tie layer.

The multilayer structure wherein each tie layer comprises a maleic anhydride-grafted polymer selected from maleated linear low density polyethylene or maleated polypropylene.

The multilayer structure wherein the inner skin layer comprises an ionomer-high density polyethylene blend optionally filled with about 10 to about 20 weight % of inorganic pigment; and comprising at least one tie layer.

The multilayer structure wherein the an outer skin layer comprises the polyamide-ionomer blend composition; the interior core layer comprises polyamide filled with about 10 to about 30 weight % of inorganic filler or the polyamide-ionomer blend; the inner skin layer comprises the polyamide-ionomer blend; and tie layers positioned between the core layer and the outer skin layer and between the core layer and the inner skin layer.

The multilayer structure wherein each tie layer comprises a maleic anhydride-grafted polymer selected from maleated linear low density polyethylene or maleated polypropylene.

The multilayer structure wherein the structure comprises from 8 to 12 mils in total of the polyamide-ionomer blend composition in one or more layers and from 3 to 5 mils in total of polyethylene, a polyethylene-based composition or a combination thereof in one or more layers.

As used herein, a polyethylene-based composition is a composition containing at least 70 weight % of polyethylene and up to 30 weight % of additional polymers, or a polyethylene grafted with a functional comonomer such as maleated polyethylene, preferably maleated linear low density polyethylene.

The multilayer structure wherein the polyamide in each of the layers is nylon-6 and the ionomer comprises an acid copolymer comprising from 5 weight % to 15 weight % of an alpha, beta-unsaturated $C_3$-$C_8$ carboxylic acid and from 0.5 weight % to 12 weight % of at least one comonomer that is an ethylenically unsaturated dicarboxylic acid or derivative thereof selected from maleic acid, fumaric acid, itaconic acid, maleic anhydride, or a $C_1$-$C_4$ alkyl half ester of maleic acid; wherein the carboxylic acid functionalities present are at least partially neutralized to carboxylate salts comprising one or more alkali metal cations.

The multilayer structure wherein the polyamide-ionomer blend composition comprises 10 to 40 weight % of filler and 8 to 15 weight % of pigment.

EXAMPLES

Materials Used

ION-1: A copolymer of ethylene and 19 weight % of methacrylic acid, neutralized with Zn cations to a level of about 36%, MI of 1.3 g/10 min.
ION-2: A copolymer of ethylene and 15 weight % of methacrylic acid, neutralized with Zn cations to a level of about 60%, MI of 0.7 g/10 min.

Tie-2: a maleic anhydride modified linear low density polyethylene (LLDPE), with density of 0.91 g/cm$^3$ and melt index of 2.7 g/10 min, commercially available from DuPont.
Tie-3: a maleic anhydride modified linear low density polyethylene (LLDPE), with density of 0.91 g/cm$^3$ and melt index of 3.1 g/10 min, commercially available from DuPont.
TiO$_2$: titanium dioxide commercially available from DuPont as Ti-Pure® R105 or comparable material.
TiO$_2$ Concentrate: 70 weight % titanium dioxide pre-dispersed in ethylene methacrylate copolymer commercially available as 111676 White COP MB from Ampacet (660 White Plains Road, Tarrytown, N.Y. 10591).
ZnO Concentrate: 45 weight % zinc oxide pre-dispersed in ethylene methacrylic acid copolymer.
Fillers used are summarized in the following table.

| Filler | material | Commercial designation | Particle shape | diameter (μm) | length (μm) | bulk density (kg/m$^3$) | true density (kg/m$^3$) |
|---|---|---|---|---|---|---|---|
| F1 | wollastonite | Nyglos ® 8 | rod | 12 | 156 | 480 | 2900 |
| F2 | coated wollastonite | Nyglos ® 8 10012 | rod | 12 | 156 | 480 | 2900 |
| F3 | wollastonite | Nyglos ®G | rod | 55 | 825 | 720 | 2900 |
| F4 | mica | Suzorite ® 60S | platy | 150-500 | | 176-291 | 2700 |
| F5 | glass fibers | Chopvantage ® HP3660 | fiber | 10 | 3000-4000 | | 2460 |
| F6 | talc | Jetfine ® 3CA | White platy | 1 | | | |
| F7 | talc | Jetfine ® 3CC | Tan platy | 1 | | | |
| F8 | talc | Luzenac ® HAR-T84 | platy | 2 | | | |

ION-3: A copolymer of ethylene and 10.5 weight % of methacrylic acid, neutralized with Zn cations to a level of about 69%, MI of 1.1 g/10 min.
ION-4: A copolymer of ethylene, 23 weight % of n-butyl acrylate and 9 weight % of methacrylic acid, neutralized with Zn cations to a level of about 50%, MI of 0.8 g/10 min.
EnBAGMA: A copolymer of ethylene, 28 weight % of n-butyl acrylate and 5 weight % of glycidyl methacrylate, MI of 12 g/10 min.
AI-1: A copolymer of ethylene, 11 weight % of methacrylic acid and 6 weight % of ethyl hydrogen maleate, neutralized with Zn cations to a level of about 50%, MI of 0.1 g/10 min.
AI-2: an anhydride ionomer terpolymer comprising ethylene, 13 weight % of acrylic acid and 4 weight % of ethyl hydrogen maleate neutralized with Zn cations to a level of 50%.
PA-6: nylon-6 homoploymer available commercially as Ultramid® B27E from BASF.
PA-12A: nylon-12 homopolymer available commercially as Rilsan® AMNO from Arkema.
PA-12B: nylon-12 homopolymer available commercially as Rilsan® AESNO from Arkema.
PA-610: nylon-610 copolymer available from DuPont as Zytel® RS LC3090.
PA-612: nylon-612 copolymer available from DuPont as Zytel® 158.
PA-612/6T: nylon-612/6T copolymer available from DuPont under the tradename Zytel®.
HDPE: high density polyethylene with MI of 2.8 available from DuPont as Alathon® 7030.
Tie-1: a maleic anhydride modified linear low density polyethylene (LLDPE), with density of 0.91 g/cm$^3$ and melt index of 1.7 g/10 min, commercially available from DuPont.

Additives used are summarized in the following table.

| Additive | function | material | Commercial designation |
|---|---|---|---|
| Add1 | lubricant | zinc stearate | Commercial grade |
| Add2 | UV absorber | Oxanilide | Tinuvin ® 312 |
| Add3 | UV light stabilizer | HALS | Tinuvin ® 770 |
| Add4 | UV light stabilizer | HALS | Chimassorb ® 440 |
| Add5 | antioxidant | Phenolic antioxidant and phosphite | Irganox ® B1171 |
| Add6 | antioxidant | Phenolic antioxidant | Irganox ® 1010 |
| Add7 | antioxidant | Phenolic antioxidant and phosphite | Irganox ® B215 |
| Add8 | processing stabilizer | trisarylphosphite | Irgafos ® 168 |
| Add9 | Neutralizing agent | ZnO concentrate | |
| Add10 | UV light stabilizer | HALS | Chimassorb ® 944FD |
| Add11 | UV absorber | Oxanilide | Tinuvin ® 234 |
| Add12 | processing stabilizer | Sodium hypophosphite | Commercial grade |
| Add13 | UV light stabilizer | HALS | Chimassorb ® 2020 |
| Add14 | UV absorber | hydroxyphenyl benzotriazole class | Tinuvin ® 326 |
| Add15 | antioxidant | | Akrochem ® 383WSP |
| Add16 | antioxidant | | HS711 |
| Add17 | antioxidant | phenolic antioxidant | Irganox ® 1098 |
| Add18 | lubricant | Zinc stearate | Commercial grade |

Several commercial backsheet structures were evaluated as standards:

HRPET: Hydrolysis resistant PET, 12 mil thickness, commercially available as PYE3000 from Coveme SPA, Bologna, Italy.

TPT: Tedlar®/PET/Tedlar®, 12 mil thickness, commercially available as Icosolar® 2442 from Isovoltaic AG, Leibring, Austria or 1200 Dun-solar TPT backsheet, commercially available from DUNMORE Corporation, 145 Wharton Rd., Bristol, Pa. 19007.

APA: A three-layer sheet comprising a core layer comprising polyester and two skin layers comprising modified polyamide, commercially available as Icosolar® APA 4004 from Isovoltaic AG, Liebring, Austria.

AAA: A three-layer sheet comprising a core layer comprising modified polyamide and two skin layers comprising modified polyamide, commercially available as Icosolar® AAA 3554 from Isovoltaic AG, Liebring, Austria.

Blends of materials listed above were prepared by melt blending following the procedure described or similar processes. Compounding was done using a 25 mm 38/1 L/D ZSK-25 World Lab twin-screw extruder comprised of nine 100 mm long barrels manufactured by Krupp Werner & Pfleiderer (Coperion) or similar processes. The polymers were pre-blended and then fed to the throat of the extruder (barrel 1) using a K-Tron® loss-in-weight feeder. The fillers were fed using a second K-Tron® feeder to the extruder using a side feeder at Barrel 4. There was a vacuum pulled on the melt before and after addition of the filler (at barrel 4 and barrel 8). The melt blend exiting the extruder die face (after barrel 9) was die face-cut using a Gala cutter. Typical operating conditions are shown in Table 1.

The collected pellets were dried overnight at 70 to 85° C. in an air circulating Blue M tray dryer oven that was fitted with a nitrogen purge. Each of the dried polymer samples were used to cast 8-inch (228 mm) wide, nominally 0.33 to 0.35 mm thick sheets. Sheets were cast using a 31.75-mm diameter 30/1 L/D single screw extruder, built by Wayne Machine (Totowa, N.J.), fitted with a 3/1 compression ratio, single-flight screw with 5 L/D of a melt mixing section. The extruder die was a 203-mm wide coat hanger type flat film die with a 0.35 mm die gap. The molten polymer film exiting from the die was cast onto a 203-mm wide by 203-mm diameter double shell spiral baffle casting roll fitted with controlled temperature cooling water. The casting roll and die were built by Killion Extruders (Davis Standard, Cedar Grove, N.J.). Extruder conditions typical for all compositions are provided in Table 2.

TABLE 1

| | Set Point (° C.) | Actual (° C.) |
|---|---|---|
| Temperature Control Zone 1 (Barrel 1 feed) | uncontrolled | |
| Temperature Control Zone 1 (Barrel Zones 2 and 3) | 240-260 | 240-260 |
| Temperature Control Zone 2 (Barrel Zones 4 and 5) | 230-260 | 230-260 |
| Temperature Control Zone 3 (Barrel Zones 6 and 7) | 230-260 | 232-260 |
| Temperature Control Zone 4 (Barrel Zones 8 and 9) | 230-260 | 232-257 |
| Temperature Control Zone 5 (Die) | 232-260 | 233-257 |
| Screw RPM | | 300-400 |
| Torque % | | 53-65% |
| Die pressure (Mpa) | | 5.3-5.9 |
| | | (770-860 psig) |
| Melt Temperature ° C. | | 276-297 |
| Overall rate polymers-fillers-additives | | 135-165 gpm |
| Vacuum (mm Hg) Zone 4 and 8 | | 51 KPa |
| | | (15 in Hg) |

TABLE 2

| Extruder Conditions | Set Point (° C.) | Actual (° C.) |
|---|---|---|
| Barrel Zone 1 | 240 | 240-241 |
| Barrel Zone 2 | 235-240 | 232-240 |
| Barrel Zone 3 | 230-240 | 230-240 |
| Barrel Zone 4 | 230-240 | 230-240 |
| Filter Flange | 230-240 | 230-240 |
| Adapter | 230-240 | 230-240 |
| Die End | 230-245 | 230-245 |
| Flat Die | 230-240 | 230-240 |
| Melt Temp (before filter) | | 231-237 |
| Melt Temp (after filter) | | 230-240 |
| Melt Press (MPa) before filter | | 4.6-8.7 |
| | | (670-1260 psig) |
| Extruder Screw Speed (rpm) | | 55 |
| Cast Roll speed m/min | | 1.6 (5.2 fpm) |

The compositions of the melt blends are shown in Tables 3 and 4.

TABLE 3

| Material | C1 | C2 | C3 | 1 | 2 | 3 | 4 | 5 | 6 | 7 | 8 | 9 | 10 | 11 | 12 |
|---|---|---|---|---|---|---|---|---|---|---|---|---|---|---|---|
| Filler Loading (%) | 0 | 0 | 0 | 0 | 15 | 0 | 0 | 25 | 25 | 25 | 25 | 25 | 0 | 15 | 0 |
| | | | | | | | | Weight % | | | | | | | |
| PA-6 | 58.74 | 49.74 | 45.84 | | | | | | | | 26.6 | 17.7 | | | 49.9 |
| PA-12A | | | | 21.54 | 19.90 | 16.81 | | | | | | | | | |
| PA-12B | | | | 32.31 | 29.84 | 25.21 | | | | | | | | | |
| PA-6 | | | | | | | | | | | | | | | |
| PA-610 | | | | | | | | | | | | | | | |
| PA-612/6T | | | | | | | 34.6 | 33 | 33 | 33.2 | 17.7 | 26.6 | 34.6 | 37.7 | |
| PA-612 | | | | | | | 11.5 | 11 | 11 | 11.1 | | | 11.5 | 12.6 | |
| ION-2 | 39.16 | 33.16 | 30.56 | 44.06 | 33.16 | 34.38 | | | 25 | 29.5 | 29.5 | 29.5 | 30.8 | 33.6 | |
| ION-4 | | | | | | | 30.8 | 29.4 | | | | | | | |
| AI-1 | | | | | | | | | | | | | | | 33.3 |
| EnBAGMA | | | | | | | | | 4.4 | | | | | | |
| F5 | | 15.00 | | | 15.00 | | | 25.0 | 25.0 | | | | | | |
| F6 | | | | | | | | | | | | | | 15.0 | |
| F7 | | | | | | | | | | 25 | 25 | 25 | | | |
| F8 | | | | | | | | | | | | | | | |

TABLE 3-continued

|  | C1 | C2 | C3 | 1 | 2 | 3 | 4 | 5 | 6 | 7 | 8 | 9 | 10 | 11 | 12 |
|---|---|---|---|---|---|---|---|---|---|---|---|---|---|---|---|
|  |  |  |  |  |  |  | Filler Loading (%) |  |  |  |  |  |  |  |  |
|  | 0 | 0 | 0 | 0 | 15 | 0 | 0 | 25 | 25 | 25 | 25 | 25 | 0 | 15 | 0 |
| Material |  |  |  |  |  |  | Weight % |  |  |  |  |  |  |  |  |
| Add1 | 0.50 | 0.50 | 0.50 | 0.50 | 0.50 | 0.50 |  |  |  |  |  |  |  |  | 0.7 |
| TiO$_2$ |  |  |  |  |  |  |  |  |  |  |  |  |  |  | 15 |
| TiO$_2$ Concentrate |  |  | 21.50 |  | 21.50 | 21.50 |  |  |  |  |  |  | 21.5 |  |  |
| Add2 | 0.45 | 0.45 | 0.45 | 0.45 | 0.45 | 0.45 |  |  |  |  |  |  |  | 0.2 |  |
| Add3 |  |  |  |  |  |  |  |  |  |  |  |  |  | 0.6 |  |
| Add5 | 0.25 | 0.25 | 0.25 | 0.25 | 0.25 | 0.25 |  |  |  |  |  |  |  | 0.3 | 0.2 |
| Add8 |  |  |  |  |  |  | 0.5 | 0.5 | 0.5 | 0.4 | 0.4 | 0.4 | 0.5 |  | 0.1 |
| Add10 |  |  |  |  |  |  | 0.3 | 0.3 | 0.3 | 0.2 | 0.2 | 0.2 | 0.3 |  |  |
| Add13 | 0.90 | 0.90 | 0.90 | 0.90 | 0.90 | 0.90 |  |  |  |  |  |  |  |  |  |
| Add14 |  |  |  |  |  |  | 0.3 | 0.3 | 0.3 | 0.2 | 0.2 | 0.2 | 0.3 |  |  |
| Add15 |  |  |  |  |  |  | 0.5 | 0.5 | 0.5 | 0.4 | 0.4 | 0.4 | 0.5 |  |  |

TABLE 4

| Example | Filler Loading (%) | Weight % | | | | | | |
|---|---|---|---|---|---|---|---|---|
|  |  | PA6 | ION-2 | Al-1 | F1 | F2 | F3 | F4 |
| C1 | 0 | 60 | 40 |  |  |  |  |  |
| 12A | 0 | 60 |  | 40 |  |  |  |  |
| C5 | 15 | 51 | 34 |  | 15 |  |  |  |
| 13 | 15 | 51 |  | 34 | 15 |  |  |  |
| C6 | 30 | 42 | 28 |  | 30 |  |  |  |
| 14 | 30 | 42 |  | 28 | 30 |  |  |  |
| 15 | 40 | 36 |  | 24 | 40 |  |  |  |
| 16 | 30 | 42 |  | 28 |  | 30 |  |  |
| 17 | 40 | 36 |  | 24 |  |  |  | 40 |
| C7 | 15 | 51 | 34 |  |  | 15 |  |  |
| 18 | 15 | 51 |  | 34 |  | 15 |  |  |
| C8 | 30 | 42 | 28 |  |  |  | 30 |  |
| 19 | 30 | 42 |  | 28 |  |  | 30 |  |

The 0.35-mm thick polymer sheets were used to test properties relevant to PV backsheets.

Test Methods

Ash:

Samples were weighed into a crucible and heated for 15 minutes in an 800° C. muffle furnace. The reported number represents the % of sample remaining in the crucible. This test was used to verify that the proper loading of filler was achieved.

Tensile Properties (ASTM D882-12)

were measured on 25 mm by 150 mm coupons die cut from the sheet. Five coupons were oriented so that the long direction was in the machine direction (MD) and five coupons were oriented so that the long direction was in the transverse direction (TD). Coupons were conditioned at 50% RH and 23° C. for at least seven days prior to testing at 50% RH and 23° C. The gage length was 25 mm and the cross-head speed was 508 mm/min. The reported results are the average of five coupons. A combination high Young's Modulus (measure of stiffness) and at least 100% elongation (higher elongation suggests better toughness) to break is preferred.

Coefficient of Linear Thermal Expansion (ASTM E813-13)

was measured on 4.9 by 65 mm coupons die cut from the sheet. Three coupons were oriented so that the long direction was in the MD and three coupons were oriented so that the long direction was in the TD. Coupons were conditioned at 50% RH and 23° C. for at least seven days prior to testing. The thermal mechanical analyzer was set up with the film fiber probe and a 0.1 N preload force was applied. Specimens were cooled to −60° C. prior to the start of the run and the heated a rate of 5° C./min to 90° C. The slope of the best fit linear line between −60° C. and 90° C. was taken as CLTE (μm/m/° C.). The average of two test results in each orientation was reported. A lower coefficient of linear thermal expansion is preferred so that the thermoplastic backsheet expands and contacts the encapsulant layer.

Moisture Vapor Transmission Rate (MVTR) at 38° C. and 100% RH was measured on coupons cut from sheet according to ASTM F1249.

Moisture Vapor Transmission Rate (MVTR) at 85° C.

measured on a Permatran 3/33 model using a Yamato DKN402 oven. ASTM F1249-06 was followed except that the temperature was 85° C.

Moisture Uptake at 50% RH and 23° C. or water immersion at 85° C.

This test measured the amount of water absorbed into a sheet sample (typically 25 mm wide by 150 mm long) die cut from the sheet after the indicated exposure condition. Moisture absorbed was determined by Karl Fischer titration as per ASTM D6869-03 (150° C. oven temperature).

Shrinkage after heat treating for 30 minutes in air-circulating oven at 150° C.

Rectangles were scissor cut from the sheet. Samples were allowed to condition at 50% RH and 23° C. for at least seven days prior to measuring sheet dimension in MD and TD. Samples were then suspended by a hook in a pre-heated air circulating oven at 150° C. for 30 minutes after which the sheet samples were removed from the oven allowed to condition for at least 48 hours at 50% RH and 23° C. before the MD and TD lengths were measured again. Changes in dimension are reported as the percent reduction in the dimension as a result of conditioning at 150° C.

Color Measurement (ASTM E1347-06)

Color of samples was measured using a Hunter Lab Colorquest XE Colorimeter (L*, a*, b*). L is a measure of whiteness; whiter materials have higher L values. The color of pellets of Composition 11 was measured: L*=76.3, a*=−0.6 and b*=2.4.

Summaries of the test results are given in Tables 5 and 6.

TABLE 5

Tensile properties (ASTM D882-12)

|  | Young's Modulus (MPa) | | Strain at break (%) | | CLTE (μm/m/° C.) | |
| --- | --- | --- | --- | --- | --- | --- |
|  | MD | TD | MD | TD | MD | TD |
| C1 | 655 | 648 | 555 | 542 |  |  |
| C2 | 1289 | 683 | 8 | 32 | 52 | 137 |
| C3 | 621 | 638 | 530 | 443 | 146 | 194 |
| 1 | 641 | 634 | 532 | 510 |  |  |
| 2 | 1324 | 723 | 9 | 36 | 61 | 151 |
| 3 | 607 | 586 | 531 | 181 | 154 | 269 |
| 4 | 517 | 469 | 591 | 500 |  |  |
| 5 | 936 | 862 | 12 | 18 |  |  |
| 6 | 1531 | 917 | 4 | 10 | 80 | 138 |
| 7 | 1272 | 1184 | 221 | 53 | 119 | 110 |
| 8 | 1086 | 903 | 174 | 66 | 97 | 121 |
| 9 | 1088 | 920 | 260 | 98 | 98 | 132 |
| C1A | 82.8 | 83.6 | 507 | 451 | 240 | 229 |
| C4 | 100 | 79 | 484 | 451 |  |  |
| C5 | 154 | 102 | 458 | 428 | 148 | 234 |
| 13 | 118 | 101 | 431 | 298 |  |  |
| C6 | 249 | 108 | 162 | 19 |  |  |
| 14 | 181 | 125 | 12.6 | 16.2 |  |  |
| 15 | 194 | 138 | 3.8 | 5.4 |  |  |
| 16 | 261 | 114 | 64 | 20.8 |  |  |
| 17 | 171 | 161 | 3.8 | 4.8 |  |  |
| C7 | 1179 | 114 | 73.7 | 36 | 134 | 144 |
| 18 | 1149 | 107.8 | 91 | 50 |  |  |
| C8 | 178.8 | 177 | 9 | 6.6 |  |  |
| 19 | 163 | 141 | 9 | 8.2 |  |  |
| APA | 2266 |  | 138 |  | 33 | 64 |
| AAA | 706 |  | 217 |  | 97 | 199 |
| Dun-solar TPT | 2463 |  | 165 |  | 60 | 80 |
| Coveme | 1374 |  | 242 |  | 226 | 288 |
| Coveme PYE 3000 | 2141 | 2158 | 135 | 114 | 586.3 | 227.9 |
| Isovoltaic 2442 | 3123 | 3241 | 101 | 81 | 33.5 | 25.5 |

The test results in Table 5 show that adding fillers increased stiffness as measured by a higher Young's modulus and reduced toughness as measured by elongation or strain at break. Fillers also reduced the Coefficient of Linear Thermal Expansion and on a weight basis, bigger rodlike or platelike fillers reduce CLTE more. Comparative Example C1A contained no filler and had CLTE greater than 200 μm/m/° C. Comparative Example C5 containing 15 weight % of wollastonite had an MD CLTE of less than 155 μm/m/° C. and Comparative Example C7 containing 15 weight % mica had an MD CLTE of less than 142 μm/m/° C.

TABLE 6

|  | MVTR At 38° C. (g-mm/[m²-day]) | | Water uptake at 23° C. | | shrinkage at 150° C. | |
| --- | --- | --- | --- | --- | --- | --- |
|  | Sample 1 | Sample 2 | At 50% RH % | in water % | MD % | TD % |
| C1 |  |  | 2.5 | 7.3 | 0.8 | 0.0 |
| C2 | 7.82 |  |  | 5.6 | 0.0 | 0.4 |
| C3 | 4.54 |  |  | 4.7 | 0.2 | 0.7 |
| 1 |  |  | 2.0 | 5.4 | 1.3 | 0.3 |
| 2 | 1.45 |  | 1.6 | 4.7 | 0.1 | 0.5 |
| 3 | 1.16 |  |  | 1.4 | 2.6 |  |
| 4 | 2.92 | 3.05 | 1.9 | 1.9 | 0.1 | 0.6 |
| 5 | 8.55 | 9.09 | 1.1 | 2.4 | 0.0 | 0.3 |
| 6 | 30.51 | 28.25 | 1.1 | 3.3 | 0.0 | 0.6 |
| 7 | 0.66 |  | 0.9 | 1.8 |  |  |
| 8 |  |  | 1.2 | 3.5 |  |  |
| 9 | 0.78 |  | 1.2 | 3.0 |  |  |
| C1A | 95 | 99 | 2.5 | 7.3 | 0 | 0.3 |
| C4 | 64 | 62 | 2.4 | 6.4 | 0.5 | 0.6 |
| C5 | 72 | 70 |  | 5.6 | 0.2 | 1 |
| 13 | 62 | 61 |  | 5.3 | 0.5 | 0.7 |
| C6 | 48 | 40 | 1.6 | 5.3 | 0.1 | 0.7 |
| 14 | 67 | 69 |  | 4.7 | 0.2 | 0.3 |
| 15 |  |  |  | 4.8 | 0.1 | 0.7 |
| 16 | 43 | 41 | 1.7 | 4.9 | 0 | 0.3 |
| 17 | 330 | 366 | 1.4 | 4.7 | 0 | 0 |
| C7 | 54 | 51 | 2 | 5.4 | 0.5 | 0.3 |
| 18 | 63 | 63 | 2.1 | 5.6 | 0.2 | 0.3 |
| C8 | 32 | 32 | 1.6 | 4.7 | 0.4 | 0 |
| 19 | 65 | 67 | 1.6 | 4.7 | 0 | 0 |
| APA | 0.77 |  |  |  |  |  |
| AAA | 1.14 |  |  |  |  |  |
| Dun-solar TPT | 0.73 |  |  |  |  |  |
| Coveme | 0.75 |  |  |  |  |  |
| Coveme PYE 3000 | 0.79 |  | 0.2 | 1.4 | 1.0 | 0.3 |
| Isovoltaic 2442 | 0.79 |  | 0.3 | 0.5 | 0.2 | 0.0 |

As shown in Table 6, replacing some or all of the polyamide 6 in the alloy with a long chain polyamide reduced the moisture uptake. The addition of fillers tended to reduce the moisture vapor transmission rate, with some exceptions. Sample 7, a 25 weight % talc filled alloy of ionomer and long chain polyamide, had the lowest measured water uptake at 50% and 100% relative humidity. Example 17 contained 40 weight % of mica and had a very high MVTR (higher than the sample that contained no filler). With small rod-shaped fillers, the polyamide-anhydride ionomer examples had lower MVTR than comparable polyamide-conventional ionomer compositions. With mica filler, the opposite was observed. Most of the tested samples had very low shrinkage (with or without filler) after 30 minutes at 150° C. These shrinkage numbers are very close to the error in the measuring device.

The results in Tables 5 and 6 suggested bigger filler types (like fiberglass or mica) were better at reducing sheet CLTE and increasing sheet stiffness but resulted in very low elongation to break and had negative effect on moisture transmission.

Tables 7 and 8 record the stiffness (Young's modulus) and elongation (strain at break) for the MD-oriented coupons after 48, 1000, 2000 and 3000 hours of damp heat conditioning at 85° C. The mineral-filled alloys based on the polyamide-ionomer compositions are much stiffer than the unfilled samples C3 and 3. The polyamide portion of the polyamide-ionomer alloy was presumably undergoing further crystallization under the 85° C. and 100% RH conditioning so the observed stiffness (Young's Modulus) increased with time. Because hydrolysis and/or thermal degradation were also occurring there was a reduction in the amount of elongation in the coupon before it broke.

TABLE 7

MD Young's Modulus (MPa) after damp heat conditioning at 85° C.

| | 48 hours | 500 hours | 1000 hours | 2000 hours | 3000 hours |
|---|---|---|---|---|---|
| C3 | 462 | 480 | 495 | 572 | 565 |
| 3 | 621 | 646 | 669 | 648 | 696 |
| 7 | 1272 | | 1886 | 1886 | |
| 8 | 1086 | | 1446 | 1446 | |
| 9 | 1088 | | 1529 | 1529 | |
| TPT Dunmore Dun-solar™ 1200 | 2365 | 2476 | 2386 | 2689 | |
| PET Coveme PET | 1098 | 1310 | 1204 | 1579 | |
| AAA | 820 | 814 | 827 | 779 | 855 |

TABLE 8

MD Elongation to Break after damp heat conditioning at 85° C.

| | 48 hours | 500 hours | 1000 hours | 2000 hours | 3000 hours |
|---|---|---|---|---|---|
| C3 | 427 | 479 | 447 | 403 | 430 |
| 3 | 537 | 504 | 495 | 504 | 411 |
| 7 | 221 | | 59 | 60 | |
| 8 | 174 | | 65 | 75 | |
| 9 | 260 | | 82 | 151 | |
| TPT Dunmore Dun-solar™ 1200 | 137 | 128 | 89 | 7 | |
| PET Coveme PET | 307 | 192 | 277 | 201 | |
| AAA | 104 | 28 | 25 | 24 | 15 |

Table 8 shows that in most cases the elongation to break decreased with conditioning time due to hydrolysis of the polyamide or PET. The addition of talc mineral fillers caused a relatively rapid drop off in the elongation to break. A compounding process that improved the dispersion of the talc filler in the polyamide-ionomer alloy would reduce the rate of loss of elongation during damp heat conditioning. Adding 15 weight % of $TiO_2$ (a much smaller, denser particle, so easier to disperse) to samples C3 and 3 resulted in no significant change in elongation to break over the 3000 hours of damp heat conditioning.

Additional blends were prepared with additives as shown in Table 9.

TABLE 9

| Blend Material | A | B | C* | D* | E | F* | G | H | I | J |
|---|---|---|---|---|---|---|---|---|---|---|
| | | | | | Weight % | | | | | |
| Blend A | | | | | 83.9 | | | | 73.9 | |
| Blend C | | | 90 | | | 85 | | | | |
| PA-6 | 60 | 0 | 60 | | | | 60 | | | 39.23 |
| PA-12A | 0 | 22 | 0 | | | | | | | |
| PA-12B | 0 | 33 | 0 | | | | | | | |
| AI-1 | 40 | 45 | 0 | | | | 40 | | | |
| ION-1 | | | | 40 | | | | | | 31.36 |
| ION-2 | | | | | | | | 35.7 | | |
| HDPE | | | | | | | | 53.54 | | |
| ZnO Conc. | | | | | | | | | | 1.7 |
| $TiO_2$ | | | | 15 | 15 | | 10 | 10 | | 15 |
| Talc | | | | | 10 | | | 15 | F6 10 | |
| Add1 | | | | 0.7 | | | | | | |
| Add2 | | | | | | | | | 0.2 | |
| Add3 | | | | | | | | 0.15 | 0.6 | |
| Add5 | | | | | 0.2 | | | | 0.3 | 0.28 |
| Add6 | | | | | 0.1 | | | 0.15 | | 0.15 |
| Add7 | | | | | | | | 0.15 | | |
| Add8 | | | | 0.1 | | | | | | |
| Add10 | | | | | | | | 0.31 | 0.7 | |
| Add11 | | | | | | | | | | 0.35 |
| Add12 | | | | | | | | | | 0.13 |
| Add18 | | | | | | | | | | 1.1 |

*Commercially available from LTL Color Compounders, Inc. 20 Progress Drive, Morrisville, PA 19067.
Additional UV stabilizer and antioxidant additives may also be present (not included in the weight %).

The blends in Table 9 were combined and melt blended with additional materials to provide polyamide-ionomer compositions summarized in Table 10 useful for PV backsheets. Other fillers were included such as talc. Example 10 had no filler but had 21.5 weight % of $TiO_2$ Concentrate as a pigment.

TABLE 10

| | Filler Loading (%) | Blend A | Blend C | Blend G | $TiO_2$ Conc. | F6 | F7 | Add2 | Add3 | Add5 | L* | a* | b* |
|---|---|---|---|---|---|---|---|---|---|---|---|---|---|
| C9 | 0 | | 100 | | | | | | | | | | |
| C10 | 30 | | 70 | | | | 30 | | | | | | |
| 20 | 30 | 70 | | | | | 30 | | | | | | |
| C11 | 15 | | 85 | | | | 15 | | | | | | |
| 21 | 15 | 85 | | | | | 15 | | | | | | |
| 22 | | | | | 77.7 | 21.5 | | 0.2 | 0.6 | 0.3 | 89.3 | −0.2 | 3.3 |
| 23 | 15 | | | | 84.2 | | 15 | 0.2 | 0.6 | 0.3 | 47.5 | 1.1 | 3.1 |
| 24 | 25 | | | | 74.3 | | 25 | 0.2 | 0.6 | 0.3 | 58.6 | −1.3 | 3.9 |
| 25 | 15 | | | | 70.1 | 14.2 | 15 | 0.2 | 0.6 | 0.3 | 84.6 | −0.9 | 3.3 |

The color of pellets of Compositions 22-25 was measured and the values indicated in Table 7. Compositions using talc filler F6 were whiter than with talc filler F7.

Tables 11 and 12 list the property tests on the sheet samples.

TABLE 11

| | Tensile properties (ASTM D882-12) | | | | CLTE (μm/m/° C.) | | | |
|---|---|---|---|---|---|---|---|---|
| | Young's Modulus (MPa) | | Strain at break (%) | | MD | | TD | |
| | MD | TD | MD | TD | Sample 1 | Sample 2 | Sample 1 | Sample 2 |
| C9 | 548 | 566 | 560 | 533 | 212 | 202 | 194 | 205 |
| C10 | 1426 | 1197 | 200 | 186 | 80 | 77 | 96 | 97 |
| 20 | 1257 | 1248 | 326 | 297 | | | | |
| C11 | 963 | 856 | 377 | 395 | 126 | 112 | 151 | 138 |
| 21 | 944 | 783 | 453 | 440 | | | | |
| HRPET | 2141 | 2158 | 135 | 114 | 588.1 | 584.5 | 205 | 224.8 |
| TPT | 3123 | 3241 | 101 | 81 | 33.08 | 33.96 | 25.15 | 25.8 |

The test results in Table 10 show that smaller platelike fillers like talc can be added to the polyamide-ionomer blend at loadings as high as 30 weight % to reduce the CLTE and still maintain at least 100% elongation to break. Polyamide-anhydride ionomer compositions had roughly comparable stiffness and better strain at break than comparable polyamide-conventional ionomer compositions. The compositions had lower Young's modulus and higher strain at break than commercial backsheet materials.

TABLE 12

| | Ash Test | | MVTR at 38° C. (g-mm/[m²-day]) | | Water uptake at 23° C. | | shrinkage at 150° C. | |
|---|---|---|---|---|---|---|---|---|
| | | | | | at 50% RH | in water | MD | TD |
| | Sample 1 | Sample 2 | Sample 1 | Sample 2 | % | % | % | % |
| C9 | 2 | 2 | 9.24 | 9.62 | 2.2 | 6.3 | 0.7 | 0.7 |
| C10 | 31 | 31 | 1.88 | 1.88 | 1.4 | 4.2 | 0.2 | 0.5 |
| 20 | 30 | 30 | 1.75 | 1.75 | 1.5 | 4.4 | 0.1 | 0.5 |
| C11 | 16 | 16 | 3.88 | 4.11 | 1.8 | 5.0 | 0.2 | 0.3 |
| 21 | 16 | 16 | 3.15 | 3.20 | 1.8 | 4.6 | 0.6 | 0.5 |
| HRPET | | | 0.786 | | 0.2 | 1.4 | 1.0 | 0.3 |
| TPT | | | 0.786 | | 0.3 | 0.5 | 0.2 | 0.0 |

In Table 12, significant reductions in MVTR and moisture absorption were seen when fillers were added to the polyamide-ionomer blends. Example 20 and Comparative Example C10 contained 30 weight % talc and had MVTR of 75 or less and moisture absorption of less than 4.5 weight % at 85° C. compared to the non-filled blend (C9) that had an MVTR of over 300 g-mil/m²/day and moisture absorption at 85° C. of 6.3%. Polyamide-anhydride ionomer compositions had roughly comparable water uptake and lower MVTR than comparable polyamide-conventional ionomer compositions.

The next comparison illustrates that under equivalent compounding conditions, better mechanical and thermal properties were obtained when the mineral filler was added to a nylon-6 polyamide-anhydride ionomer alloy compared to adding the mineral filler to a nylon-6 polyamide-standard ionomer alloy. Compositions were prepared according to Table 13.

TABLE 13

| | Weight % | | | | | | Thickness of sheet |
|---|---|---|---|---|---|---|---|
| | PA-6 | ION-2 | AI-1 | Add8 | Add17 | F7 | (mm) |
| C12 | 44.80 | 30 | | 0.10 | 0.1 | 25 | 0.35 |
| 22 | 44.80 | | 30 | 0.10 | 0.1 | 25 | 0.34 |

The tensile properties were measured on sheet samples conditioned for one week at 23° C. and 50% RH and summarized in Table 14. Moisture permeation, uptake and damp heat aging are also summarized in Table 14.

TABLE 14

| | | C12 | | 22 | |
|---|---|---|---|---|---|
| | | MD | TD | MD | TD |
| Tensile properties (ASTM D882-12) | Young's Modulus (MPa) | 1113 | 938 | 1150 | 896 |
| | Strain at break (%) | 136 | 42 | 319 | 280 |
| | CLTE (μm/m/° C.) | 83.5 | 129 | 72.5 | 102 |
| MVTR at 38° C. | Transmittance (g/[m²-day]) | 6.05 | | 5.84 | |
| | Permeation (g-mm/[m²-day]) | 2.13 | | 1.97 | |
| Water uptake at 23° C. | At 50% RH (%) | 1.4 | | 1.3 | |
| | 1 week in water (%) | 4.6 | | 4.5 | |

TABLE 14-continued

|  |  | Young's Modulus | Strain at break | Young's Modulus | Strain at break |
|---|---|---|---|---|---|
| Damp heat aging at 85° C. and 100% RH | After 72 hours | 929 | 186 | 853 | 319 |
|  | After 1000 hours | 1001 | 51 | 1020 | 258 |
|  | After 2000 hrs | 1028 | 50 | 1252 | 178 |

As shown in Table 14, Young's Modulus was comparable for both compositions but the strain at break was significantly higher for the polyamide-anhydride ionomer composition. The coefficient of linear thermal expansion was lower in both MD and TD for the polyamide-anhydride ionomer composition. The permeation rate was lower with the polyamide-anhydride ionomer composition. The moisture pick-up after 1 week at 50% RH or 1 week immersed in water was slightly lower with the polyamide-anhydride ionomer composition.

Table 14 also reports the stiffness (Young's modulus) and elongation (strain at break) for the MD-oriented coupons after 72, 1000 and 2000 hours of damp heat conditioning. The mineral-filled alloy based on the polyamide-anhydride ionomer composition produced better hydrolysis resistance to damp heat aging than the one prepared with a conventional ionomer. The polyamide portion of the polyamide-ionomer alloy was presumably undergoing further crystallization under the 85° C. and 100% RH conditioning so the observed stiffness (Young's Modulus) increased with time. Because hydrolysis and/or thermal degradation were also occurring there was a reduction in the amount of elongation in the coupon before it broke. The coupons from the anhydride ionomer-polyamide composition exhibited much better retention of elongation to break over this 2000-hour conditioning period.

Three-layer coextruded backsheet structures were prepared with the structures summarized in Table 15. The term "outer skin" refers to the layer of the backsheet structure that would face outward in the photovoltaic module, the term "core" refers to a layer inside the backsheet structure, and the term "inner skin" refers to the layer of the backsheet that would face the encapsulant layer of the photovoltaic module. The three-layer sheets were prepared from 15 weight % $TiO_2$-filled and 10 weight % talc-filled polyamide-ionomer compositions. The sheets were cast on a three layer coextrusion sheet line with nominally 0.002-inch (0.05 mm) thick skin layers and 0.010-inch (0.25 mm) thick core layers. The sheet structures are given in Table 15.

TABLE 15

|  | Outer skin layer | Core layer | Inner skin layer |
|---|---|---|---|
| C13 | Blend F | Blend C | Blend F |
| C14 | Blend F | Blend D | Blend F |
| 23 | Blend F | Blend A | Blend F |
| C15 | Blend C | Blend D | Blend C |
| 24 | Blend C | Blend A | Blend C |
| 25 | Blend E | Blend B | Blend E |

Tables 16 and 17 report the test results on the three-layer sheets.

TABLE 16

| | Tensile properties (ASTM D882-12) | | | | | |
|---|---|---|---|---|---|---|
| | Young's Modulus (MPa) | | Strain at break (%) | | CLTE (μm/m/° C.) | |
| | MD | TD | MD | TD | MD | TD |
| C13 | 717 | 703 | 495 | 505 | 144.6 | 153.6 |
| C14 | 800 | 727 | 446 | 459 | 114.1 | 138.3 |
| 23 | 624 | 591 | 414 | 470 | 186.9 | 210.6 |
| C15 | 816 | 770 | 462 | 444 | 48.8 | 125.5 |
| 24 | 619 | 639 | 502 | 472 | | |
| 25 | 627 | 577 | 395 | 503 | 175.5 | 199.2 |
| HRPET | 2141 | 2158 | 135 | 114 | 586.3 | 227.9 |
| TPT | 3123 | 3241 | 101 | 81 | 33.5 | 25.5 |

TABLE 17

| | Thickness | | MVTR at 85° C. | | Water uptake at 23° C. | | shrinkage at 150° C. | |
|---|---|---|---|---|---|---|---|---|
| | | | | | At 50% RH | At 100% RH | MD | TD |
| | (mil) | (mm) | g/[m²-day]) | (g-mm/[m²-day]) | % | % | % | % |
| C13 | 14.5 | 0.368 | 250.93 | 92.33 | 1.7 | 5.6 | 0.5 | 0.9 |
| C14 | 13.9 | 0.353 | 213.68 | 75.43 | 1.6 | 4.8 | 0.1 | 0.5 |
| 23 | | | | | 1.8 | 5.8 | 0.0 | 0.7 |
| C15 | | | | | 1.6 | 4.8 | 0.2 | 0.3 |
| 24 | | | | | 1.9 | 6.1 | 0.0 | 0.7 |
| 25 | 15.6 | 0.396 | 85.84 | 33.99 | 0.9 | 2.1 | 0.1 | 0.7 |
| HRPET | 12 | 0.305 | | | 0.2 | 1.4 | 1.0 | 0.3 |
| TPT | 13 | 0.330 | 36.5 | 12.04 | 0.3 | 0.5 | 0.2 | 0.0 |

Example 25 showed very good (low) water vapor transmission and uptake compared to Comparative Examples C13 and C14.

The following General Procedure was used to laminate backsheet materials to glass and encapsulant sheets to test the properties of a photovoltaic module. For these tests, no photovoltaic layer was included, but if included laminations would be performed similarly.

Glass: 4-mm thick annealed glass from Kingston Plate and Glass (Kingston, Ontario Canada)

Encapsulant sheet: 0.015 inch thick EVA (ethylene vinyl acetate copolymer encapsulant sheet (Photocap® 15420 or 15295 sold by STR Corporation, 18 Craftsman Road, East Windsor, Conn. 06088 USA).

General Procedure for Fabricating Glass/Encapsulant/Backsheet Laminates

Rectangles of Glass/Encapsulant/Backsheet [2.5 inch by 5 inch (62 by 125 mm) or 5 inch by 5 inch (125 by 125 mm)] were laminated. The backsheet samples were dried overnight under vacuum at 30° C. prior to laminating. The glass was washed with soapy water and the layers assembled as follows:

glass/encapsulant/backsheet/10 mil thick fluoropolymer coated cloth/0.25-inch silicone rubber. If the backsheet contained an "inner layer" it was in contact with encapsulant. One-inch (25 mm) wide tabs of fluoropolymer-coated release sheet were placed between the glass and the encapsulant and the encapsulant and the backsheet. The inclusion of fluoropolymer release sheets provided a tab between glass and encapsulant or backsheet and encapsulant to initiate subsequent peel testing on laminated glass. The assembly was placed in a 12 inch by 9 inch (300 mm by 225 mm) vacuum bag (Tyvek® barrier bag Part number SI-BA-7033, supplied by Smith Induspac Ltd 140 Iber Road, Stittsville, Ontario, Canada K2S 1E9). The assembly was vacuum sealed in the bag using a Promarks TC-420LC vacuum sealer (Promarks, Inc. 1915 E. Acacia Street, Ontario, CA 91761, USA) with 60 seconds of vacuum prior to heat seal, seal time 2 seconds, cooling time 2.1 seconds. The layers were thermally bonded together by placing the vacuum-bagged assembly in a preheated air-circulating oven set at 150° C. for 30 minutes. A 2.6 kg aluminum block was placed on top of the vacuum bag to improve the consistency of the glass laminate. The glass side of the laminate was down during the thermal bonding. After 30 minutes in the oven, the vacuum bag assembly was removed and allowed to cool 10 minutes before cutting open the bag and removing the laminate.

Adhesion:

Peel tests were performed using 4 inch/minute (100 mm/min crosshead speed after conditioning at 23° C., 50% RH. Test results in Table 20 are reported as the average of four peels for each material.

TABLE 18

| | Adhesion to Encapsulant | | |
|---|---|---|---|
| | lb-f/in | N/cm | Location of peel |
| C13 | 32 | 56 | Backsheet to encapsulant |
| C14 | 40 | 70 | Combination of backsheet to encapsulant and glass to encapsulant |
| 23 | 40.5 | 71 | Backsheet to encapsulant |
| C15 | 13 | 23 | Backsheet to encapsulant |
| HRPET | 10 | 18 | Backsheet to encapsulant |
| TPT | 21 | 37 | Glass to encapsulant |

These peel strength numbers demonstrate a strong bond between backsheet and encapsulant, which confirms the polyamide/ionomer alloy sheet does not require any special surface treatment to achieve a strong bond to the EVA based encapsulant.

Damp Heat Testing:

Two glass laminates from each example film were exposed to 85° C. and 100% RH for after 0, 500 and 1000 hours of damp heat exposure. The average change in the front side (color through the glass) for the two glass laminates were measured and reported in Table 8.

TABLE 19

| | After 500 hours | | After 1000 hours | |
|---|---|---|---|---|
| | Δb* | ΔL* | Δb* | ΔL* |
| C3 | −7.6 | 0.9 | −9.8 | 0.1 |
| 3 | −4.4 | −1.1 | −6.6 | −0.6 |
| TPT | −3.6 | −2.4 | −4.7 | −2.6 |

After 1000 hours of damp heat conditioning at 85° C. and 85% RH, it was found that looking through the front glass, certain modules had yellowed. The change in color for glass/encapsulant/backsheet laminates over 1000 hours of damp heat conditions shows the commercial TPT backsheet had a change in b* color of −4.7, so it slightly yellowed. Comparative Example C3 backsheet developed roughly 2 times the change in b* color over the same conditioning interval so it had much greater yellowing. The Example 3 backsheet film had an intermediate development of b* color over the 1000 hours of conditioning, better than the Comparative Example.

Test sheets were also fabricated into small photovoltaic modules having a 2×2 array of solar cells. The components are listed in Table 20. The materials were laid up in the proper positions to prepare a functional photovoltaic module and laminated using a Meier vacuum laminator with lamination conditions of 145° C., for fifteen minutes, evacuation 3 minutes and press for 11 minutes.

TABLE 20

| Material | Brand | Code |
|---|---|---|
| EVA | Revax | R767-0.45 mm thickness |
| Solar cell | JA | Mono-125SOR22B 17.6-17.8% |
| Solder Ribbon | Sveck | Sn62 Pb36 Ag2 |
| Glass | AGC Japan | Solar grade --temper glass--low-Iron |
| Al Frame | Haida | 304 × 284 × 25 mm |
| Junction Box | Renhe | PV-RH06-60 |
| Seal silicon | Tonsan | PV1527 |
| Flux | Asahi | ANX-3133 |

Testing after Sheets were Used to Fabricate Mini Solar Modules

Damp Heat:

Two mini modules of each example film were exposed to 85° C. and 100% RH for 0, 500 and 1000 hours of damp heat exposure. The average change in the color through the glass from the front and back sides color were measured and reported in Table 18.

UV Testing:

Using the IEC 61215 UV preconditioning standard (3% UVB), one module was exposed from the front and one from the back. Tests were conducted after 0, 1, 2, 3, 4 and 5 times the IEC standard duration.

Thermal Cycling (TC):

Two modules of each state were exposed to cycles of −40° C. to 85° C. per the IEC 61215 standard. Standard properties (see below) were measured after 0, 200, 400 and 600 cycles.

Thermal Cycling-Humidity Freeze (TC-HF):

Two modules of each state were exposed to the IEC 61215 protocol of 50 cycles thermal cycling (−40° C. to 85° C.) followed by 10 cycles of humidity freeze (−40° C. to 85° C. at 85% RH). Standard properties after 0, 1, 2 and 3 intervals of 50 thermal and 10 humidity freeze cycles were measured. Testing was done after the humidity freeze portion of the cycling. In the Tables below, the number of each type of cycle is indicated.

Table 21 reports testing on mini modules that were fabricated using the backsheets listed.

TABLE 21

| | Change in module color after 1000 hours damp heat treatment | | | | Crack behavior | | |
|---|---|---|---|---|---|---|---|
| | | | | | after 150TC/20HF | after TC400 | after TC150/HF30 |
| | ΔL* front | ΔL* back | Δb* front | Δb* back | | | |
| C13 | 3.6 | 0.6 | −18.0 | −3.6 | Yes | No | Yes |
| C14 | 4.0 | 0.3 | −20.1 | −3.0 | No | No | No |
| 23 | 2.1 | 0.4 | −10.1 | −2.7 | Yes | Yes | Yes |
| C15 | 4.0 | 0.4 | −18.6 | −3.5 | No | No | No |
| 24 | | | | | | | |
| 25 | 1.8 | 0.2 | −2.5 | −3.3 | Yes | Yes | Yes |
| HRPET | 0.1 | 0.3 | −1.8 | −0.4 | No | No | No |
| TPT | 0.8 | 0.0 | −1.3 | −0.4 | No | No | No |

After 1000 hours of damp heat conditioning at 85° C. and 85% RH, it was found that looking through the front glass, certain modules had yellowed. The change in color for mini modules over 1000 hours of damp heat conditions shows the commercial TPT backsheet had a change in b* color of −1.7, so it slightly yellowed. Comparative Example C14 backsheet developed roughly 20 times the change in b* color over the same conditioning interval so it had much greater yellowing. The Example 23 backsheet film had an intermediate development of b* color over the 1000 hours of conditioning, less color development than the Comparative Example.

It was found the yellowness was due to yellowing of the encapsulant and not the backsheet. As shown in Table 21, small changes in the b color value were noted on the back side (−3 b* shift) but large changes in the b* value were noted for the front side on certain modules. It was also found that cracks were appearing on selected backsheets in the modules treated with periods of thermal cycling and freezing after high humidity exposure.

Color development correlates with MVTR. Samples with lower MVTR tend to develop less b* color on damp heat conditioning. Cracking was not observed for mini modules fabricated from sheets with polyamide-ionomer formulations that contained talc.

Additional backsheets were prepared according to Table 22. Blend K in Table 18 is a mixture of 85 weight % of a 65:35 blend of high density polyethylene and ION-1 and 15 weight % of TiO$_2$ and UV stabilizers available from Mosaic Color and Additives, 110 Sulphur Springs Road, Greenville, S.C. under the commercial designation M002132WTPEP. The sheets were tested for MVTR at 85° C. and 100% relative humidity and the results are reported as the average of 2 sheet samples.

What is claimed is:

1. A multilayer structure comprising
   an outer skin layer comprising a polyamide-ionomer blend composition;
   an interior core layer comprising polyamide or a blend of ionomer and polyamide, optionally filled with about 10 to about 30 weight % of an inorganic filler;
   an inner skin layer comprising the polyamide-ionomer blend composition, an ionomer, a polyethylene, an ionomer-polyethylene blend or an ethylene vinyl acetate copolymer optionally comprising about 10 to about 20 weight % of an inorganic pigment; and optionally
   one or more tie layers positioned between the core layer and the outer skin layer, between the core layer and the inner skin layer, or between the core layer and each of the skin layers;
   wherein the polyamide-ionomer blend composition comprises
   (i) a polymer component comprising
      1) 53 to 64 weight %, based on the combination of (1) and (2), of a polyamide;
      2) 36 to 47 weight %, based on the combination of (1) and (2), of an ionomer comprising a copolymer of copolymerized units of
         (a) ethylene;
         (b) from 2 weight % to 30 weight % of an alpha, beta-unsaturated $C_3$-$C_8$ monocarboxylic acid;
         (c) from 0 weight % to 12 weight % of at least one comonomer that is an ethylenically unsaturated dicarboxylic acid or derivative thereof selected from maleic acid, fumaric acid, itaconic acid, maleic anhydride, or a $C_1$-$C_4$ alkyl half ester of maleic acid; and
         (d) from 0 weight % to 30 weight % of monomers selected from alkyl acrylate or alkyl methacrylate,

TABLE 22

| | Outer skin layer | Tie layer | Core layer | Tie layer | Inner skin layer | MVTR (g/[m²-day]) |
|---|---|---|---|---|---|---|
| 26 | 50 μm Blend E | — | 250 μm Blend 22 | 30 μm Tie-2 | 50 μm Blend K | 56 |
| 27 | 50 μm Blend E | — | 250 μm Blend 24 | 30 μm Tie-2 | 50 μm Blend K | 46 |
| 28 | 300 μm Blend 25 | — | — | 30 μm Tie-2 | 50 μm Blend K | 44 |
| C16 | 300 μm Blend J | — | — | 30 μm Tie-2 | 50 μm Blend K | 49 |
| 29 | 300 μm Blend 25 | — | — | 30 μm Tie-1 | 50 μm Blend K | 57 |
| C17 | 300 μm Blend J | — | — | 30 μm Tie-1 | 50 μm Blend K | 66 |
| 30 | 200-250 μm Blend I | — | — | 25-50 μm Tie-2 | 50-75 μm Blend H | 56 |
| 31 | 50-55 μm Blend I | 40-50 μm Tie-3 | 150-200 μm Blend I | 40-50 μm Tie-3 | 50-55 μm Blend I | |
| 32 | 50 μm Blend 12 | — | 250 μm Blend 11 | 30 μm Tie-2 | 50 μm Blend K | 49 | wherein the alkyl groups have from one to twelve carbon atoms; wherein the carboxylic acid functionalities present are at least partially neutralized to carboxylate salts comprising one or more alkali metal, transition metal, or alkaline earth metal cations; and wherein when the polyamide comprises nylon-6 the ionomer comprises from 5 weight % to 15 weight % of an alpha, beta-unsaturated $C_3$-$C_8$ carboxylic acid and from 0.5 weight % to 12 weight % of at least one comonomer that is an ethylenically unsaturated dicarboxylic acid or derivative thereof selected from maleic acid, fumaric acid, itaconic acid, maleic anhydride, or a $C_1$-$C_4$ alkyl half ester of maleic acid; and (ii) 0 to 20 weight % of pigment;

(iii) 0 to 40 weight % of filler; wherein the combination of (ii) and (iii) comprises 8 to 50 weight % of the combination of (i), (ii), (iii) and (iv); and (iv) 0 to 5 weight % of additives selected from oxidation inhibitors, UV stabilizers and hindered amine light stabilizers.

2. The multilayer structure of claim 1 wherein the polyethylene or the ionomer-polyethylene blend independently comprises low density polyethylene, linear low density polyethylene, or high density polyethylene.

3. The multilayer structure of claim 1 wherein the polyethylene or the ionomer-polyethylene blend independently comprises high density polyethylene.

4. The multilayer structure of claim 1 wherein the inner skin layer comprises about 10 to about 20 weight % of inorganic pigment.

5. The multilayer structure of claim 1 wherein the polyamide in each of the layers is independently selected from nylon-6, nylon-11, nylon-12, nylon-66, nylon-6,10, nylon-6,12, nylon-610/6T, nylon-612/6T, nylon-6/66, nylon-6/610, nylon-6/66/610, nylon-6/6T, nylon-1010, nylon-11 and nylon-12, nylon-66/6T, nylon-6T/DT, nylon-6I/6T, nylon-6I/6T/66, or combinations thereof.

6. The multilayer structure of claim 1 wherein the polyamide in each of the layers is independently selected from nylon-6, nylon-66, nylon-610, nylon-612, nylon-6/66, nylon-6/610, nylon-6/66/610, nylon-6/6T, nylon-610/6T, nylon-12/6T, nylon-1010, nylon-11, nylon-12 or combinations thereof.

7. The multilayer structure of claim 1 wherein the polyamide in each of the layers is nylon-6 and the ionomer comprises an acid copolymer comprising from 5 weight % to 15 weight % of an alpha, beta-unsaturated $C_3$-$C_8$ carboxylic acid and from 0.5 weight % to 12 weight % of at least one comonomer that is an ethylenically unsaturated dicarboxylic acid or derivative thereof selected from maleic acid, fumaric acid, itaconic acid, maleic anhydride, or a $C_1$-$C_4$ alkyl half ester of maleic acid; wherein the carboxylic acid functionalities present are at least partially neutralized to carboxylate salts comprising one or more alkali metal cations.

8. The multilayer structure of claim 7 wherein the polyamide-ionomer blend composition comprises 10 to 40 weight % of filler and 8 to 15 weight % of pigment.

9. The multilayer structure of claim 7 wherein the polyamide-ionomer blend composition comprises 8 to 12 weight % of pigment and 12 to 18 weight % of filler.

10. The multilayer structure of claim 1 wherein the pigment comprises titanium dioxide, zinc oxide, or antimony oxide.

11. The multilayer structure of claim 1 wherein the filler comprises an inorganic oxide, carbonate, sulfate, silica, alkali and alkaline earth metal silicate, or baryte of a metal of Groups IA, IIA, IIIA, IIB, VIB or VIII of the periodic table of the elements.

12. The multilayer structure of claim 1 wherein one or more tie layer is present and each tie layer independently comprises a maleic anhydride-grafted polymer selected from maleated linear low density polyethylene, maleated polypropylene, maleated styrene-ethylene-butene-styrene triblock copolymer, maleated ethylene vinyl acetate copolymers or maleated polybutadiene; or a copolymer comprising ethylene copolymerized with a functional comonomer comprising an ethylenically unsaturated dicarboxylic acid or derivative thereof.

13. The multilayer structure of claim 1 wherein the inner skin layer comprises a polyamide-ionomer blend composition or an ionomer-high density polyethylene blend comprising about 10 to about 20 weight % of inorganic pigment; and comprising at least one tie layer.

14. The multilayer structure of claim 12 wherein each tie layer comprises a maleic anhydride-grafted polymer selected from maleated linear low density polyethylene or maleated polypropylene.

15. The multilayer structure of claim 1 wherein the inner skin layer comprises an ionomer-high density polyethylene blend comprising about 10 to about 20 weight % of inorganic pigment; and comprising at least one tie layer.

16. The multilayer structure of claim 8 wherein the outer skin layer comprises the polyamide-ionomer blend composition of claim 1; the interior core layer comprises polyamide filled with about 10 to about 30 weight % of inorganic filler or the polyamide-ionomer blend; the inner skin layer comprises the polyamide-ionomer blend; and tie layers positioned between the core layer and the outer skin layer and between the core layer and the inner skin layer.

17. The multilayer structure of claim 16 wherein each tie layer comprises a maleic anhydride-grafted polymer selected from maleated linear low density polyethylene or maleated polypropylene.

18. The multilayer structure of claim 1 wherein the structure comprises from 8 to 12 mils in total of the polyamide-ionomer blend composition in one or more layers and from 3 to 5 mils in total of polyethylene, a polyethylene-based composition or a combination thereof in one or more layers.

19. The multilayer structure of claim 17 wherein the polyamide in each of the layers is nylon-6 and the ionomer comprises an acid copolymer comprising from 5 weight % to 15 weight % of an alpha, beta-unsaturated $C_3$-$C_8$ carboxylic acid and from 0.5 weight % to 12 weight % of at least one comonomer that is an ethylenically unsaturated dicarboxylic acid or derivative thereof selected from maleic acid, fumaric acid, itaconic acid, maleic anhydride, or a $C_1$-$C_4$ alkyl half ester of maleic acid; wherein the carboxylic acid functionalities present are at least partially neutralized to carboxylate salts comprising one or more alkali metal cations.

20. The multilayer structure of claim 19 wherein the polyamide-ionomer blend composition comprises 10 to 40 weight % of filler and 8 to 15 weight % of pigment.

* * * * *